(12) United States Patent
Torii

(10) Patent No.: US 7,238,569 B2
(45) Date of Patent: Jul. 3, 2007

(54) FORMATION METHOD OF AN ARRAY SOURCE LINE IN NAND FLASH MEMORY

(75) Inventor: Satoshi Torii, Sunnyvale, CA (US)

(73) Assignee: Spansion LLC, Sunnyvale, CA (US)

( * ) Notice: Subject to any disclaimer, the term of this patent is extended or adjusted under 35 U.S.C. 154(b) by 158 days.

(21) Appl. No.: 11/113,508

(22) Filed: Apr. 25, 2005

(65) Prior Publication Data

US 2006/0240617 A1    Oct. 26, 2006

(51) Int. Cl.
*H01L 21/336*    (2006.01)
(52) U.S. Cl. .................. 438/257; 438/262; 438/264
(58) Field of Classification Search ............... 438/257, 438/262, 264
See application file for complete search history.

(56) References Cited

U.S. PATENT DOCUMENTS

| | | | |
|---|---|---|---|
| 4,242,737 A | 12/1980 | Bate | |
| 4,250,206 A | 2/1981 | Bate et al. | |
| 4,288,470 A | 9/1981 | Bate et al. | |
| 4,360,900 A | 11/1982 | Bate | |
| 6,166,959 A | 12/2000 | Gupta et al. | |
| 6,411,548 B1 | 6/2002 | Sakui et al. | |
| 6,574,140 B2 | 6/2003 | Caywood | |
| 6,376,876 B1 * | 4/2004 | Shin et al. | 257/315 |
| 6,720,579 B2 * | 4/2004 | Shin et al. | 257/68 |
| 6,953,965 B2 * | 10/2005 | Goda et al. | 257/316 |
| 6,960,500 B2 * | 11/2005 | Shin et al. | 438/201 |
| 2004/0026748 A1 * | 2/2004 | Goda et al. | 257/390 |
| 2006/0239083 A1 * | 10/2006 | Lee | 365/185.28 |

FOREIGN PATENT DOCUMENTS

| | | |
|---|---|---|
| EP | 1 207 552 A2 | 5/2002 |
| JP | 55-105375 A | 8/1980 |

OTHER PUBLICATIONS

International Search Report, Int'l Application No. PCT/US2006/015685, Int'l Filing Date Apr. 24, 2006, 2 pgs.

* cited by examiner

*Primary Examiner*—Andy Huynh
*Assistant Examiner*—David Goodwin
(74) *Attorney, Agent, or Firm*—Eschweiler & Associates, LLC

(57) ABSTRACT

Novel fabrication methods permit concurrently forming wordlines, select gates and array source lines in NAND Flash. One method forms oxide and nitride layers of an ONO stack, implants dopants into a source line region to form and unite a source line structure to a source/drain region, forms another oxide and a high-dielectric over the nitride layer, removes the ONOA stack in the source line region, forms a gate oxide in the periphery, and forms an opening in the ONOA stack in an array source line region. The method deposits and selectively removes polysilicon and the high-dielectric concurrently forming wordline and select drain gate structures in bitline contact regions, and select source gate and source line structures in source line regions. The bitline and source line contact regions are implanted to form the source line structure in the source line region and unite the source/drain regions of select source gate structures.

28 Claims, 17 Drawing Sheets

SECTION A-A'

SECTION D-D'

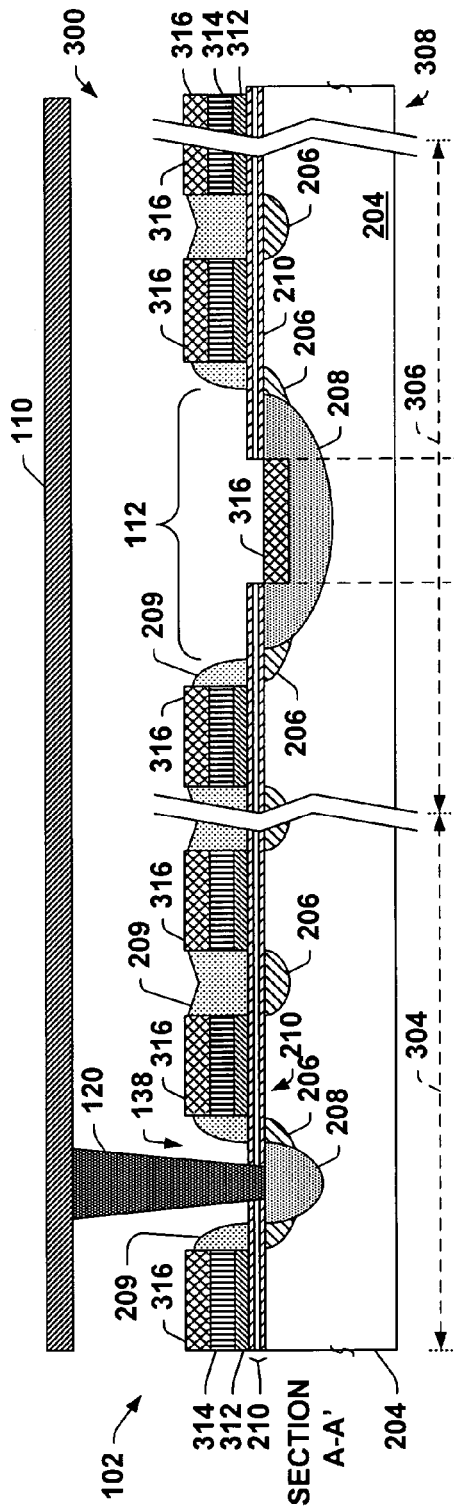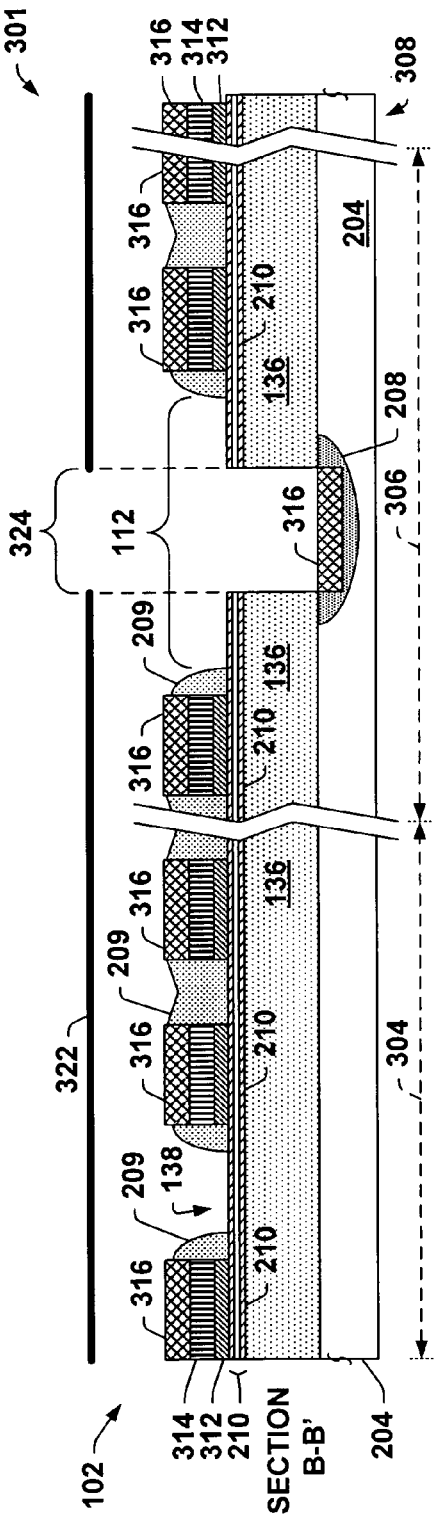
FIG. 3A PRIOR ART
FIG. 3B PRIOR ART

SECTION C-C'
PRIOR ART

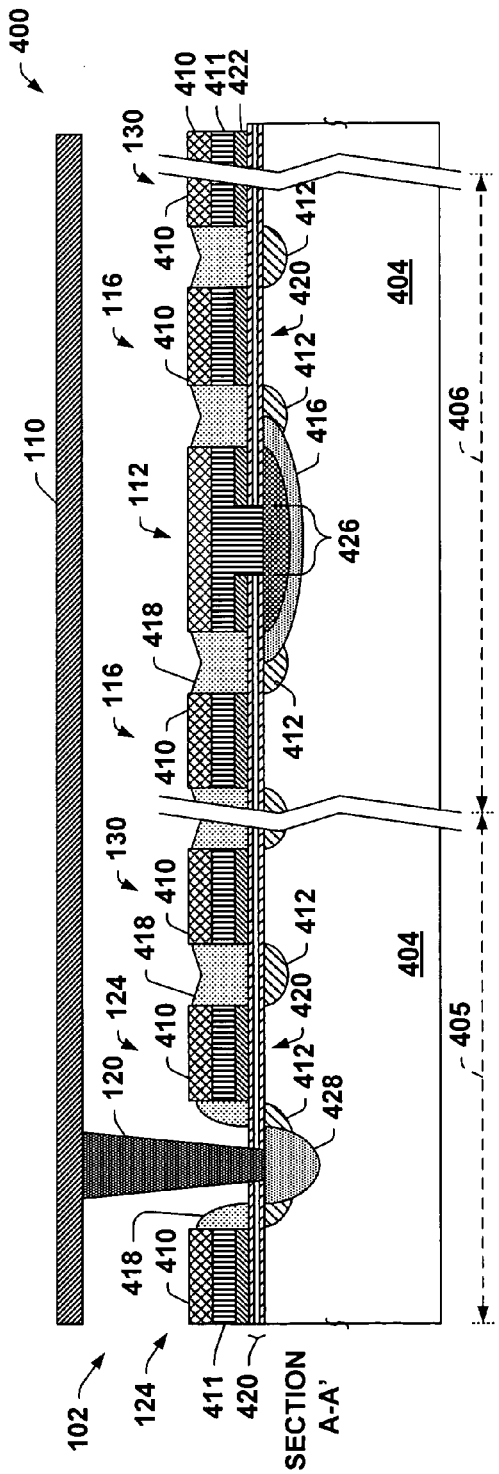
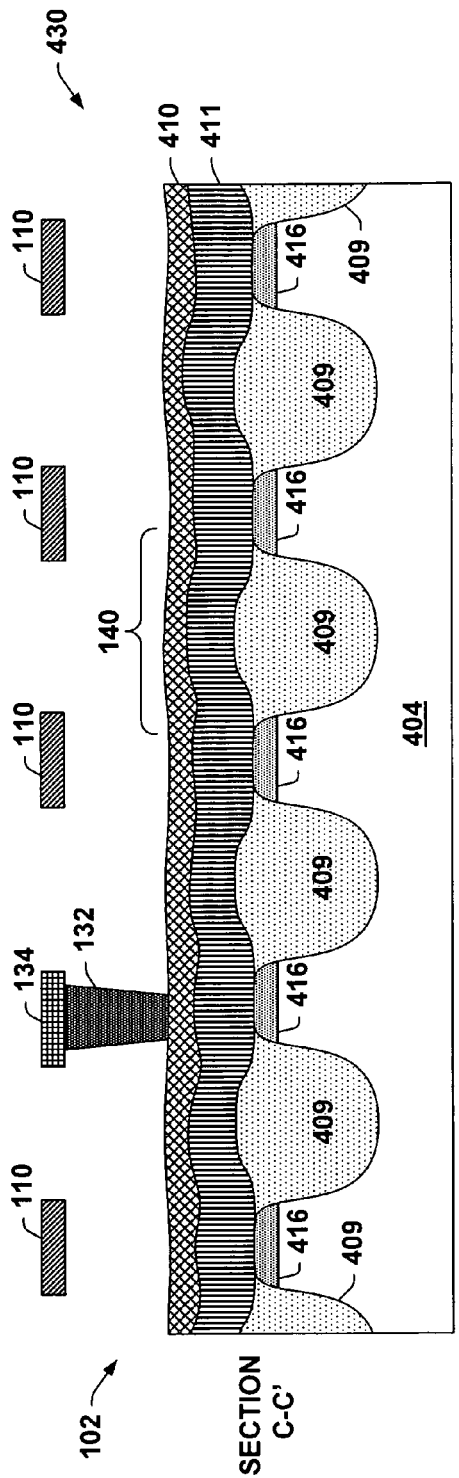

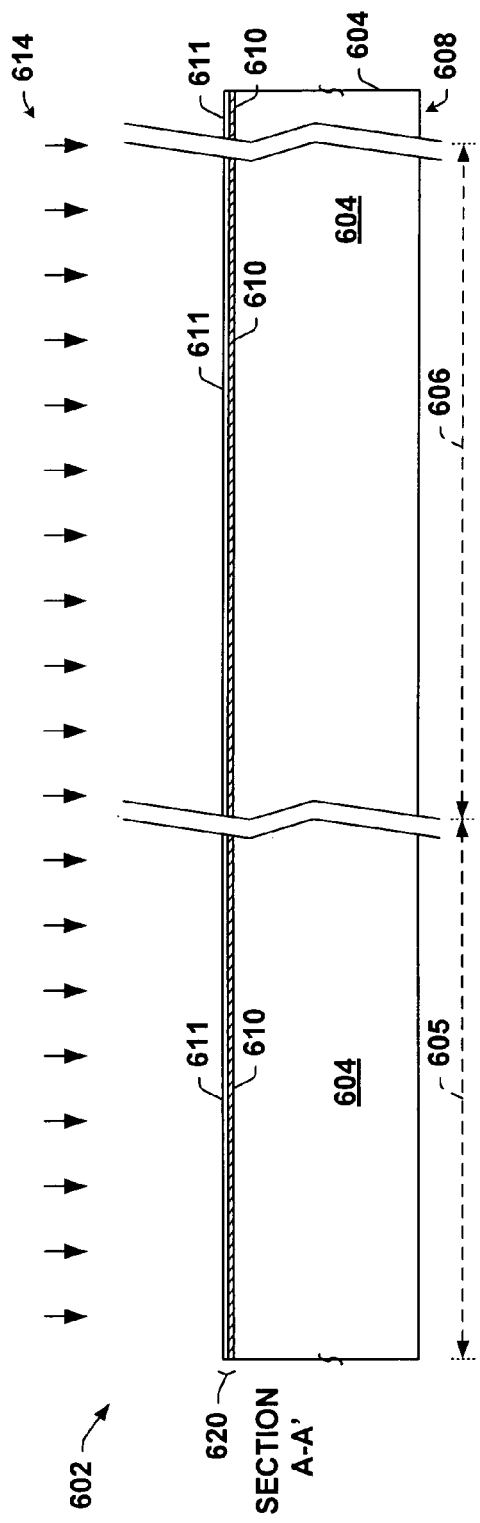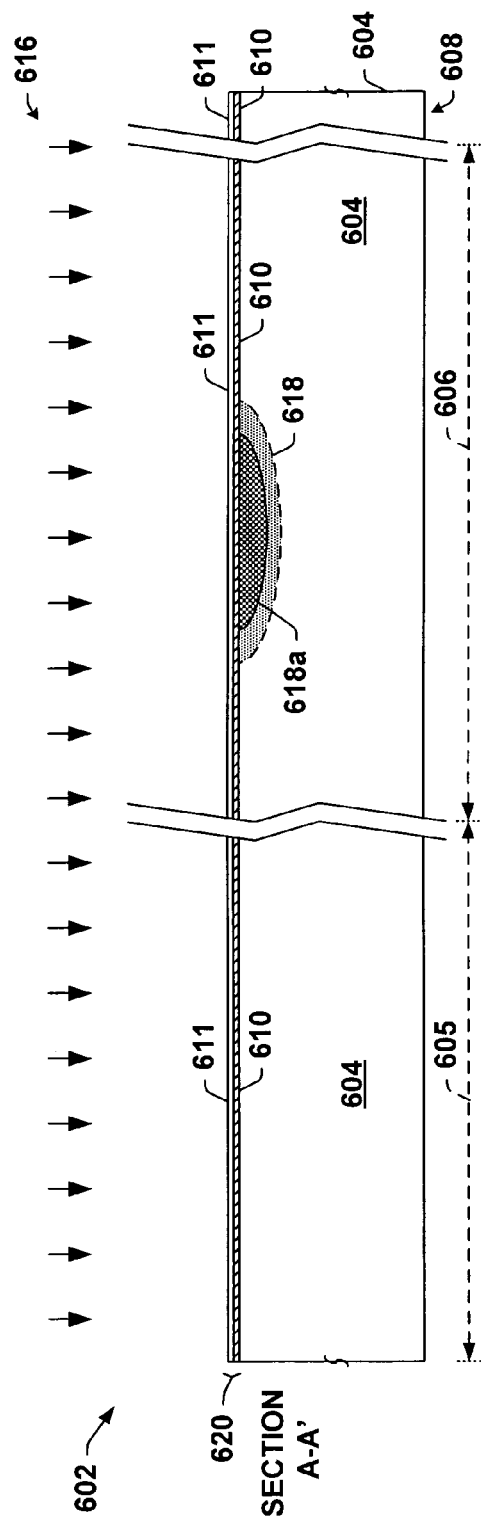

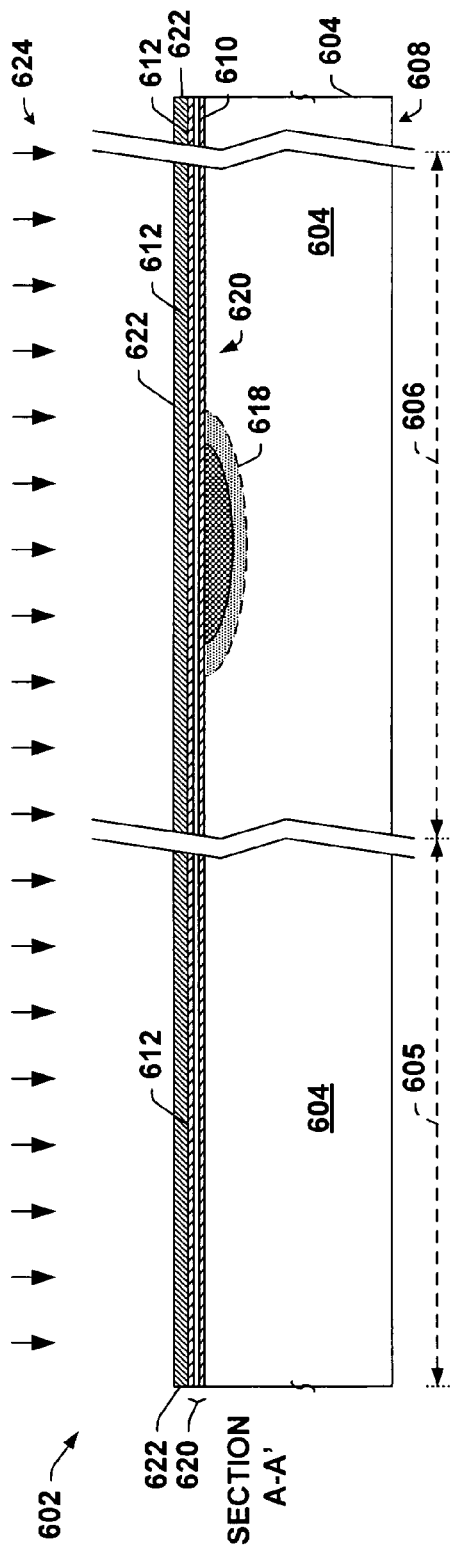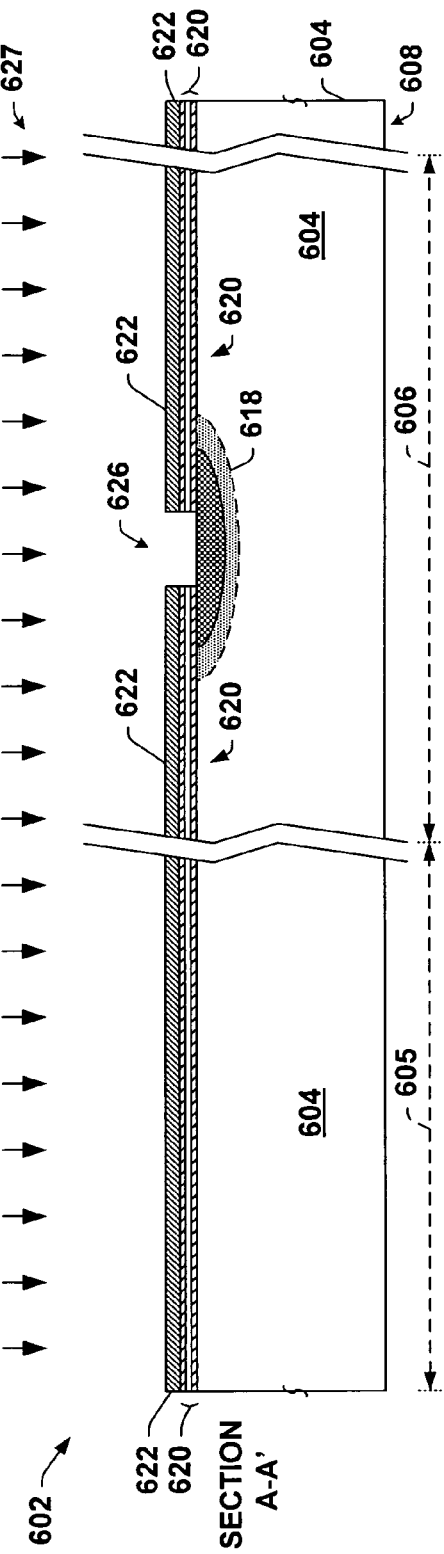

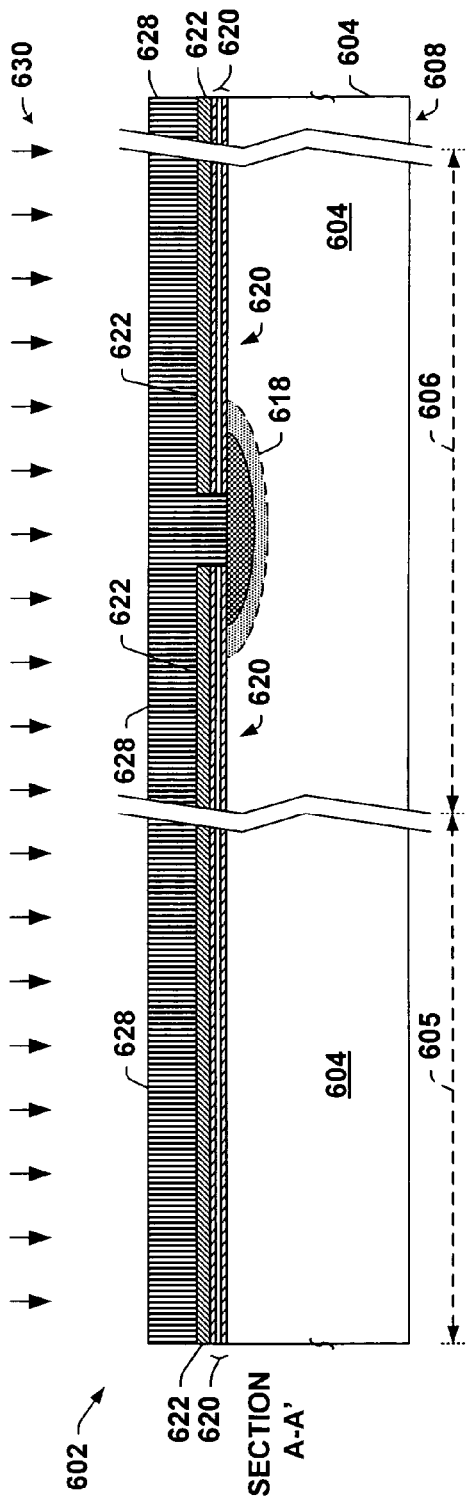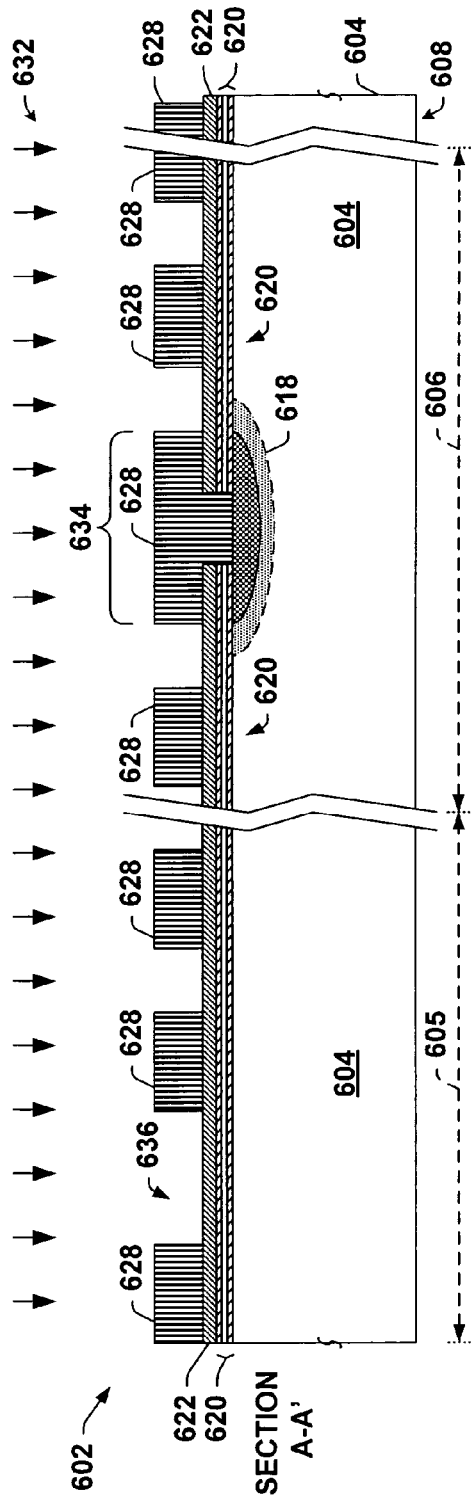

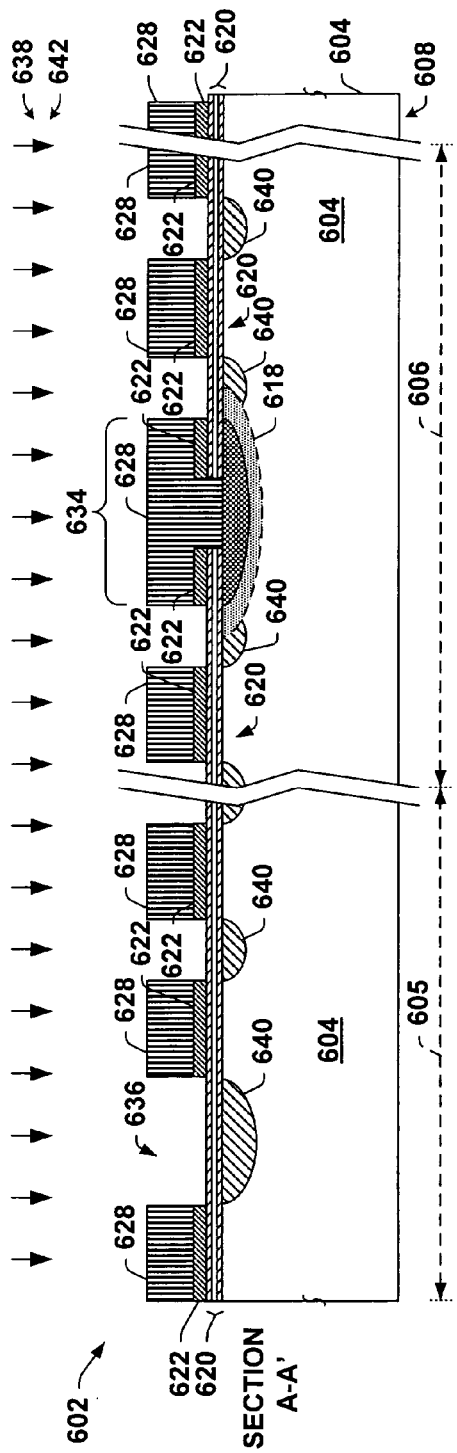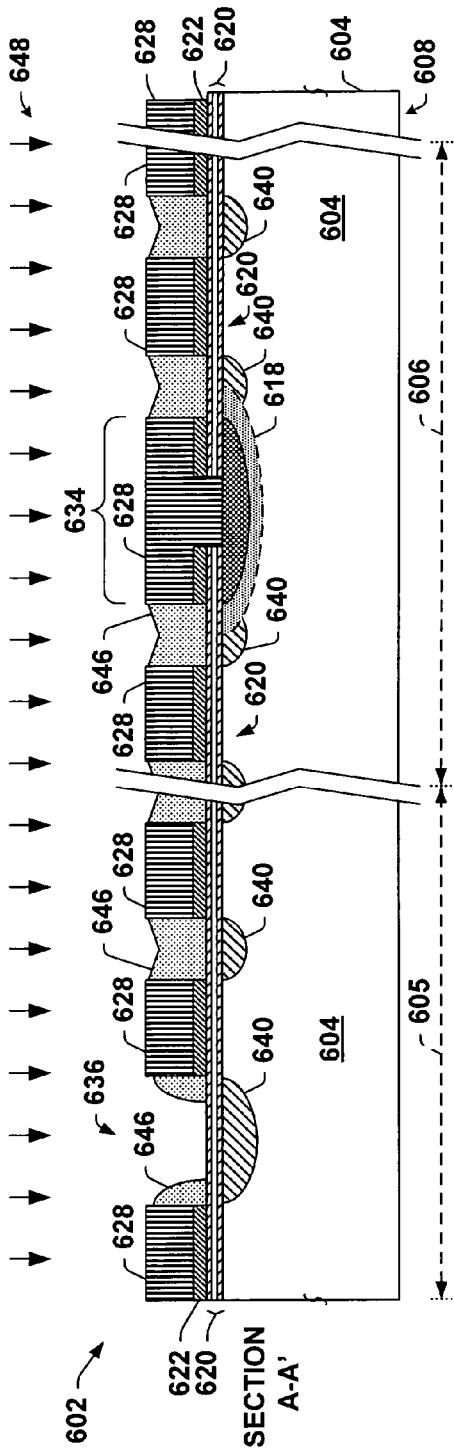

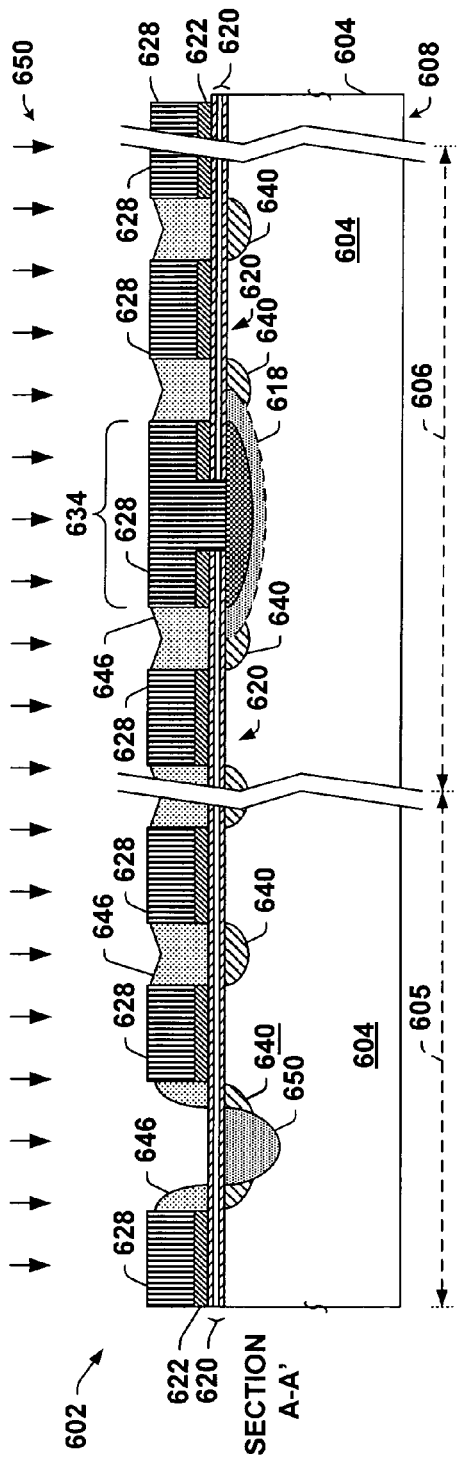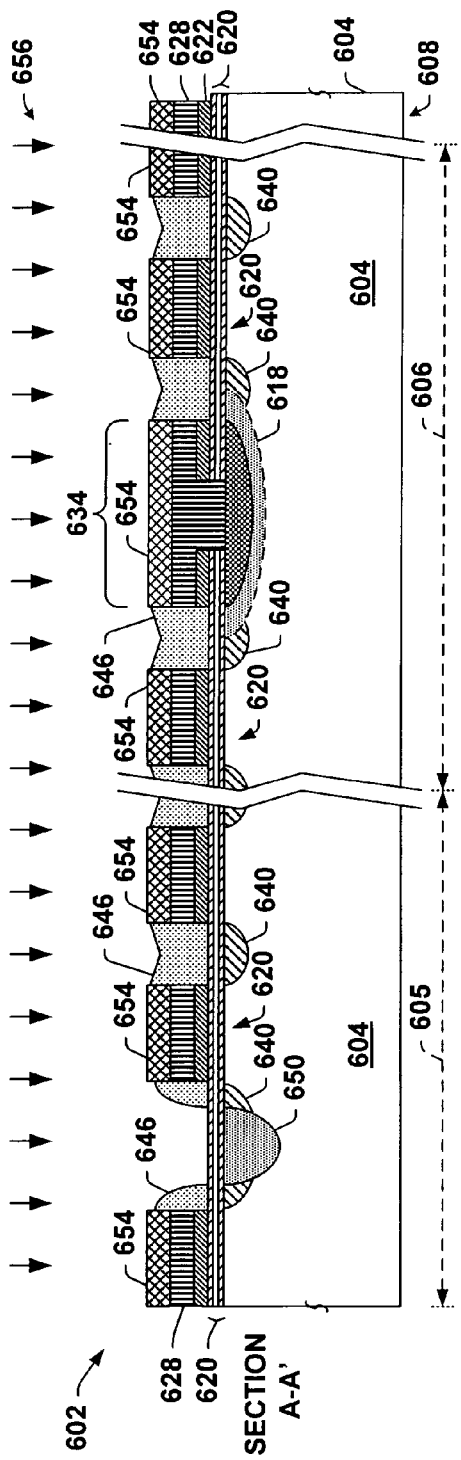

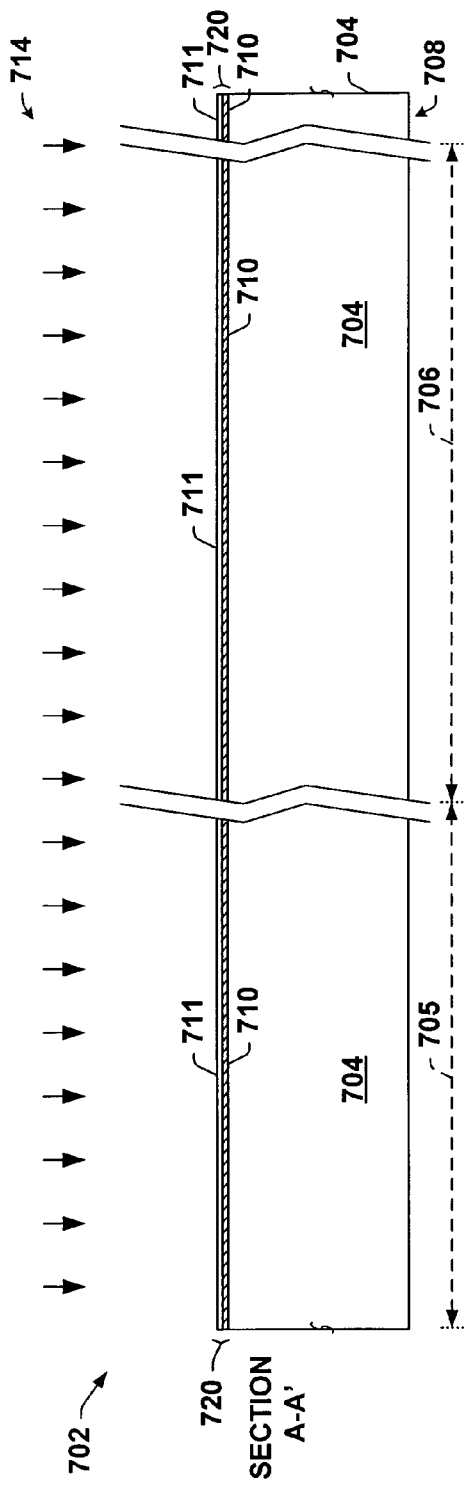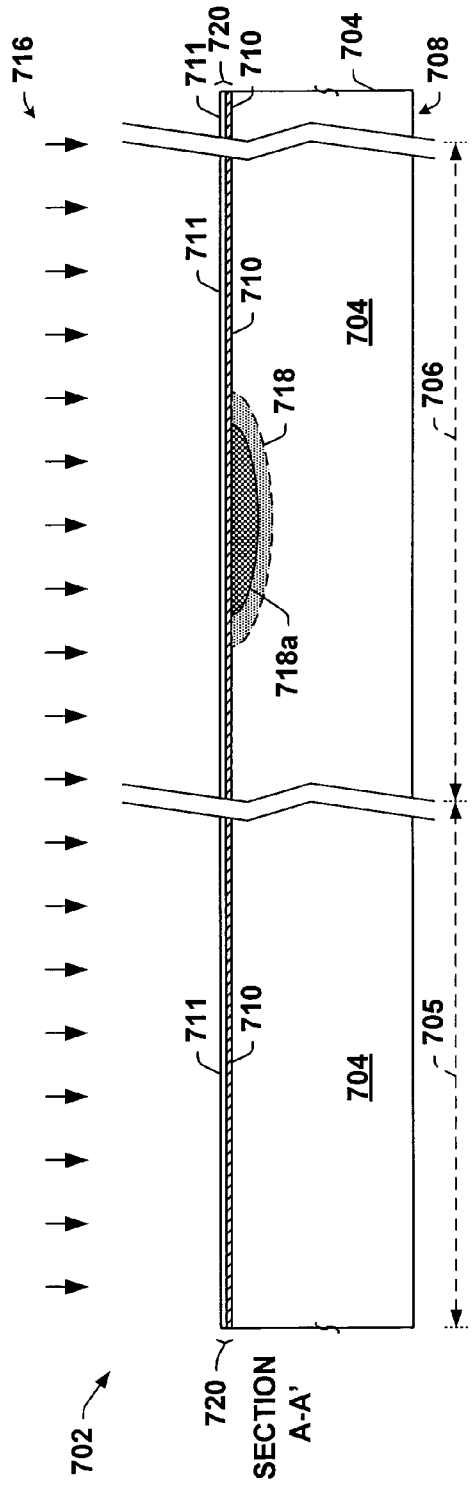

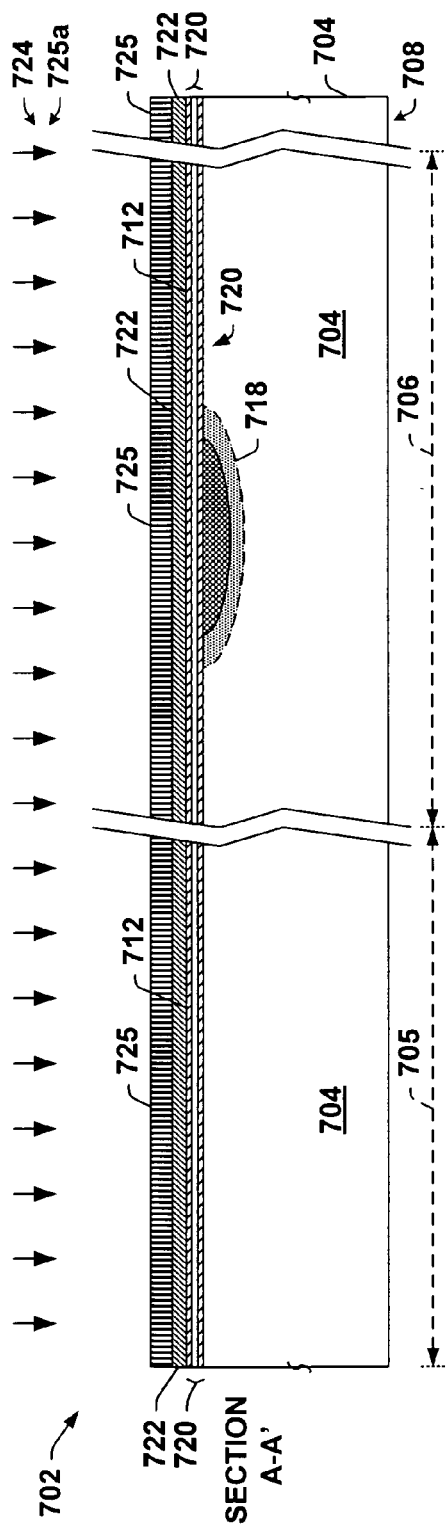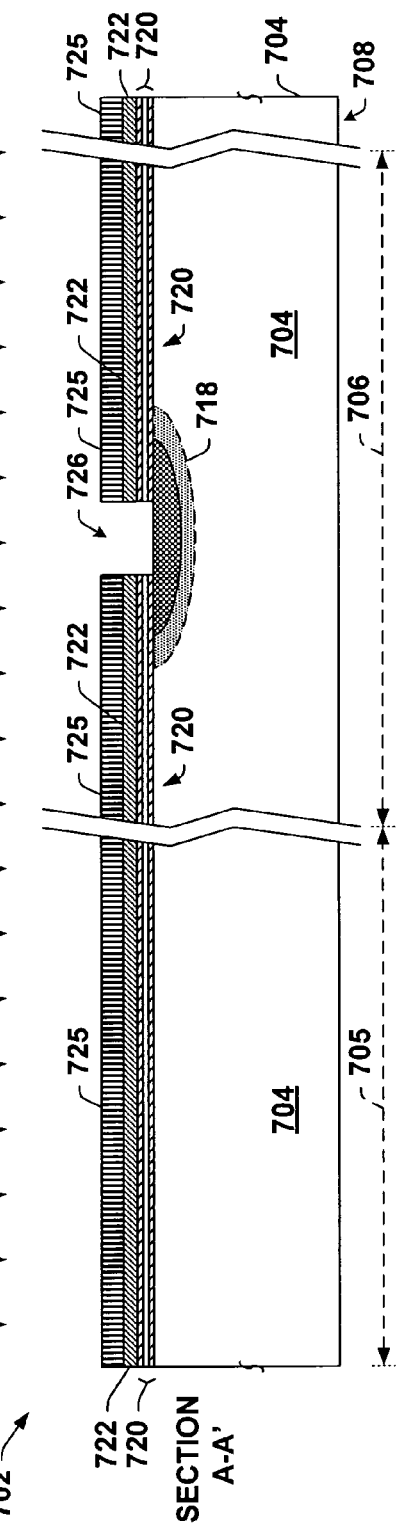

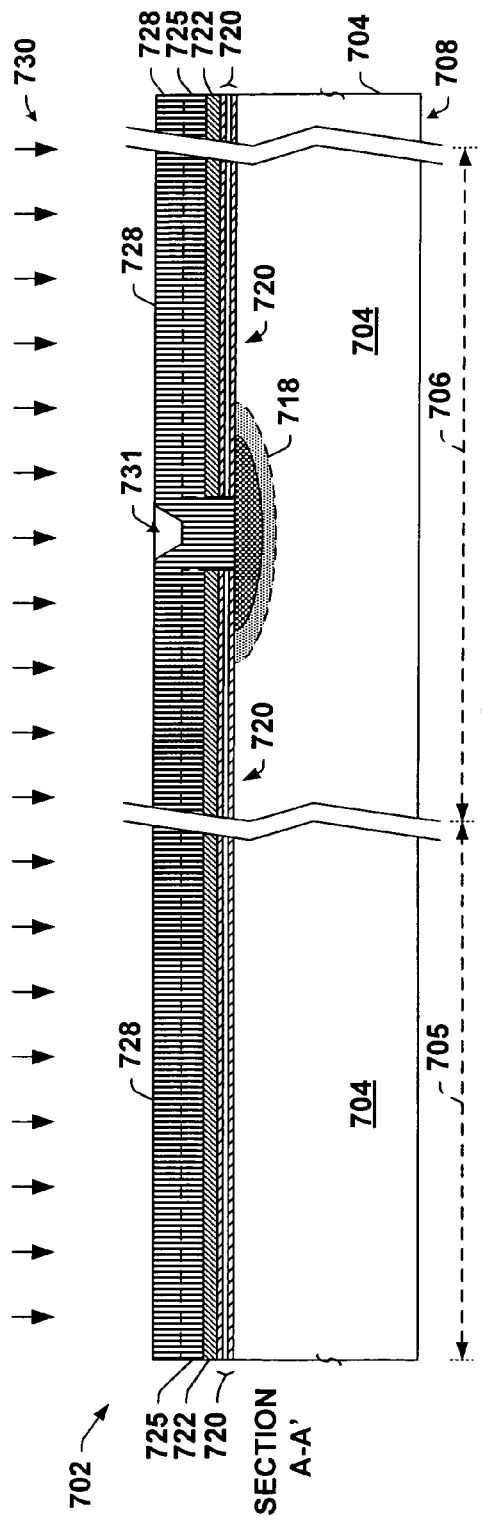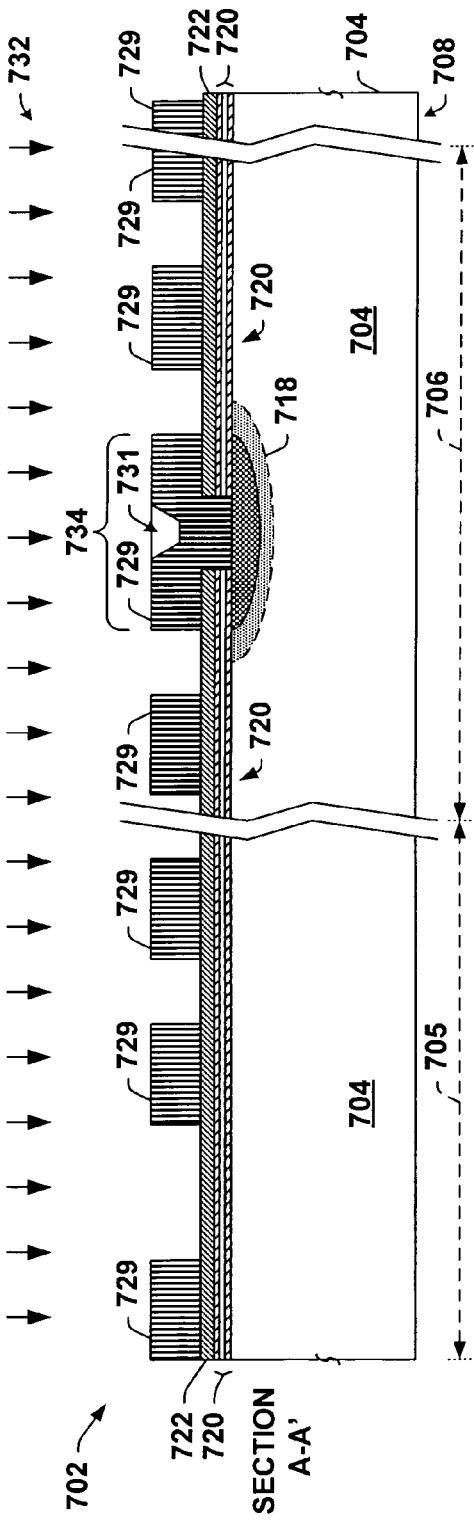

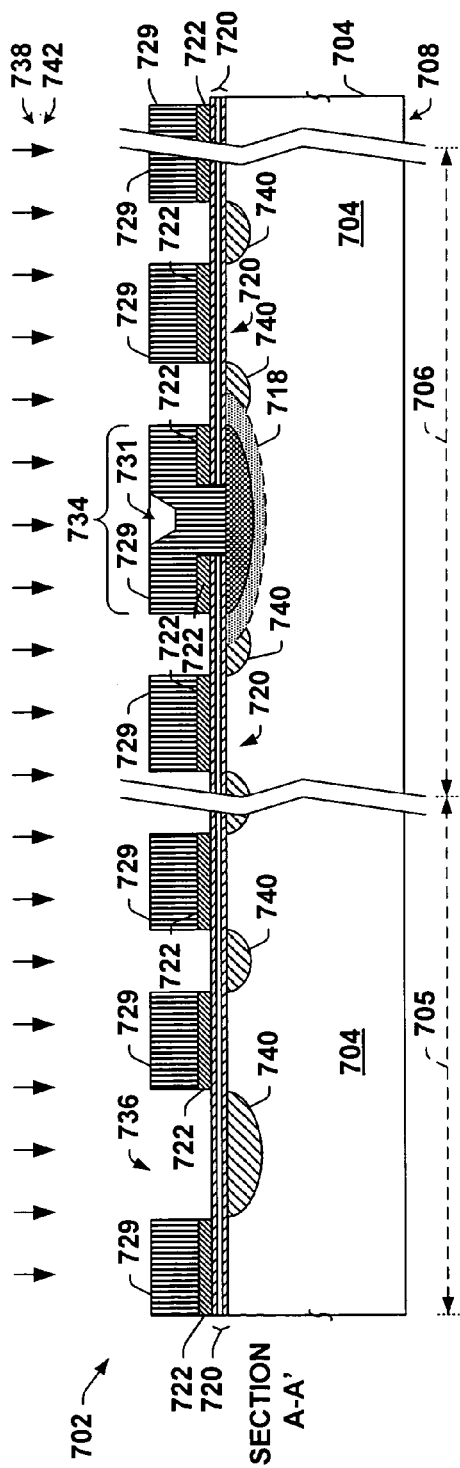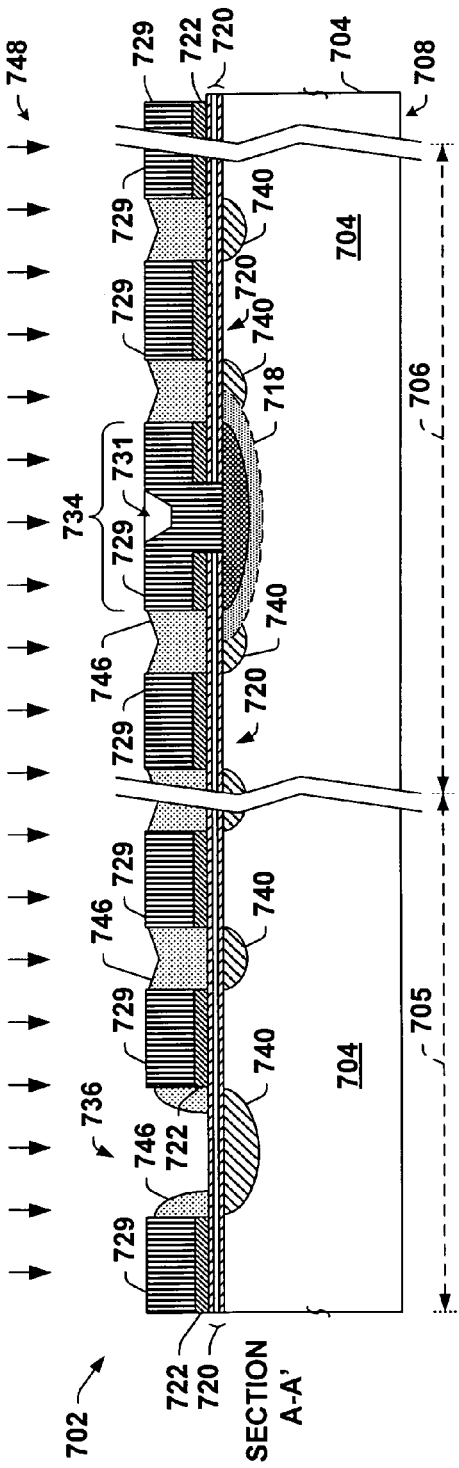

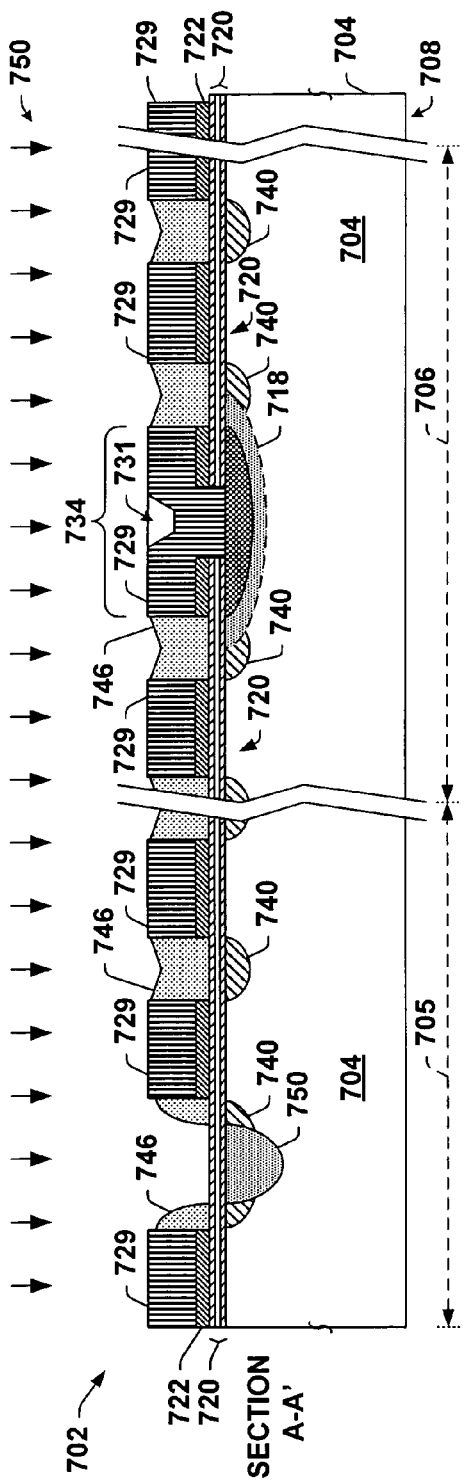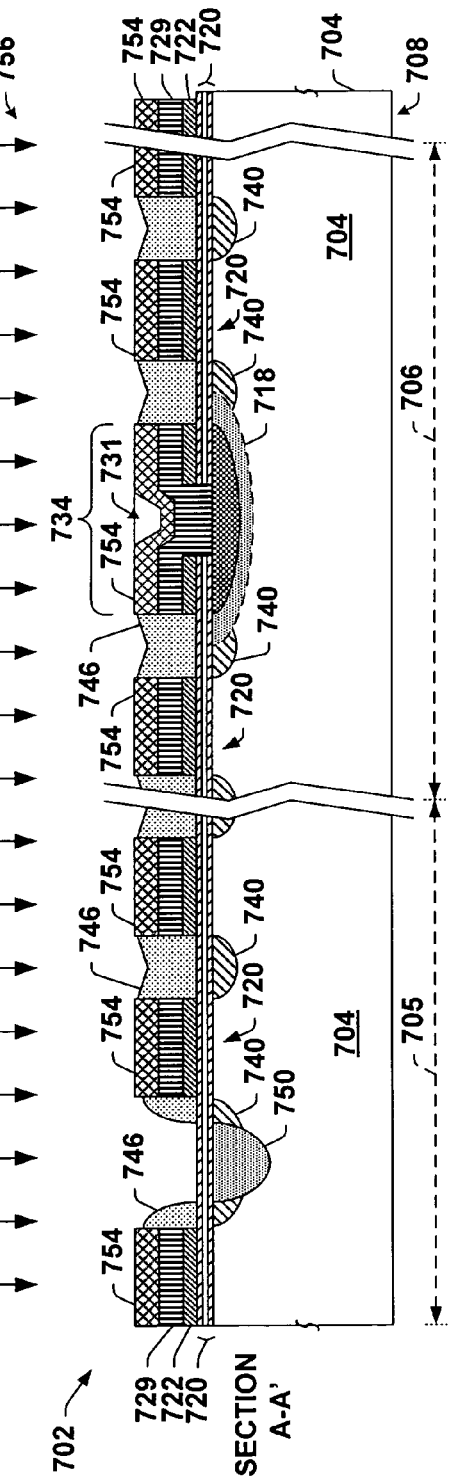

FORMATION METHOD OF AN ARRAY SOURCE LINE IN NAND FLASH MEMORY

FIELD OF INVENTION

The present invention relates generally to semiconductor device processing and more particularly to an improved method and system for simultaneously fabricating word lines, select gates, and array source lines in a NAND flash memory.

BACKGROUND OF THE INVENTION

Flash and other types of electronic memory devices are constructed of memory cells operative to individually store and provide access to binary information or data. The memory cells are commonly organized into multiple cell units such as bytes which comprise eight cells, and words which may include sixteen or more such cells, usually configured in multiples of eight. Storage of data in such memory device architectures is performed by writing to a particular set of memory cells, sometimes referred to as programming the cells. Retrieval of data from the cells is accomplished in a read operation. In addition to programming and read operations, groups of cells in a memory device may be erased, wherein each cell in the group is programmed to a known state.

The individual cells are organized into individually addressable units or groups such as bytes or words, which are accessed for read, program, or erase operations through address decoding circuitry using wordlines and bitlines. Conventional flash memories are constructed in a cell structure wherein one or more bits of information or data are stored in each flash memory cell. In typical memory architectures, each cell typically includes a MOS transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well.

The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

Other types of memory devices include ones comprising silicon or polysilicon above and below an ONO layer, these silicon-oxide-nitride-oxide-silicon devices are sometimes referred to as SONOS memory devices.

SONOS is operated in various ways. In one typical example, (Fowler-Nordheim) FN tunneling is used to program and erase, wherein charge is injected into the nitride in programming and removed from the nitride in erase. The stored charge in the nitride is uniform in this case. By changing the amount of charge stored in the nitride, multiple data may be recorded in one cell.

In another typical case, hot electrons in the channel are used to program, where charge is stored locally in the nitride at the drain side. Switching the drain and source allows storage of two bits in one cell, thus implementing multi-bit or dual-bit memory cells. In order to erase, hot holes generated at the drain or/and source side is injected in the nitride to neutralize the charge. FN tunneling may be used to erase instead of the hot hole injection.

Appropriate programming and erase schemes are chosen in consideration of the application or the purpose, but structurally the same memory cells may be used.

Core cells in flash memory devices may be interconnected in a variety of different configurations. For instance, memory cells may be configured in a NAND type memory configuration, series connected source to drain along columns of conductive bitlines, with control gates connected for selection along rows of wordlines. FN tunneling is typically used to program and erase in a NAND type memory.

Conventionally, one end of each bitline of the NAND array is connected to a common source line. In particular, select drain gate transistors are used to couple associated cells of a bitline to a bitline contact, while each of the bitlines are coupled via a select source gate transistor to a common source line. Typically, segments of the common source line for each bitline are then locally interconnected together by a conductive local interconnect structure and to a VSS supply contact. In operation, individual flash cells and the individual data bits thereof, are addressed via the respective bitlines connected to first and second source/drain regions thereof and a wordline connected to the gate using peripheral decoder and control circuitry for programming (writing), reading, erasing, or other functions.

In most such array configurations the active regions of the individual flash cells are electrically isolated from one another by an isolation structure comprising an insulative material. This isolation structure may be formed similar to that of conventional shallow trench isolation (STI) fabrication methods before the formation of the ONO layers and the polysilicon gate layer.

As device densities increase and product dimensions decrease, it is desirable to reduce the size of the various structures and features associated with individual memory cells, sometimes referred to as scaling. However, the fabrication techniques used to produce conventional NAND flash memory arrays limit or inhibit the designer's ability to reduce array dimensions. For example, in a conventional manufacturing process whereby a conductive source line structure having a local interconnect may be formed in a NAND flash memory device, the STI is initially formed and filled, and an ONO layer is formed overlying the STI and a substrate. An anisotropic etch is then used to remove the STI and ONO in an array VSS region (ARVSS), leaving a narrow opening to the underlying polysilicon of the device. After an N+ implant to join MDD regions of the select source gate transistors to the ARVSS source line, a conductive silicide layer is formed in the silicon of the wafer, and other typical lithographic processes continue as usual.

However, because it is difficult for the anisotropic etch to reach the bottom of the STI through the narrow and critically aligned opening, the formation of the conductive silicide is difficult on lateral sidewalls and the bottom of the trench, and detrimentally may become disconnected therein. Thus, in order to scale the memory cell devices to facilitate increased device densities, it is desirable to provide the widest possible conductive array VSS structures while simplifying fabrication processes. However, current processes used to form such source line structures are difficult to produce in a reliable manner, and effectively limit the ability to scale the device to the desired performance specifications. Thus, there is a need for improved manufacturing techniques by which NAND flash memory devices may be scaled without sacrificing device yield and performance.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Rather, the primary purpose of this summary is to present some concepts of the invention in a simplified form as a prelude to the more detailed description that is presented later.

The invention provides methods for fabricating an improved array source line structure (ARVSS) in a wafer of a NAND flash memory and other memory devices, the array source line structure used to provide a common source interconnection for the memory array. The methods of the present invention provide for the concurrent fabrication of an ARVSS structure, the wordlines, and the select gate transistor structures in the core region of a memory device, for example, as may be useful in NAND type memory architectures.

Although the methods of the present invention do not require changing the device operation schemes commonly used in NAND flash memory arrays, other types of operation schemes used to implement dual-bit and multi-bit cells including other types of flash memory devices are also anticipated in the context of the present invention.

One method provides for the fabrication of an array source line structure in a wafer of a NAND flash memory, comprising forming a first dielectric layer and a charge trapping layer of a multi-layer dielectric-charge trapping-dielectric stack (e.g., ONO stack) formed over a substrate and an STI of a wafer. An N+ ion species is then implanted in an array source line region, to unite the array source line structure to a drain region. A second dielectric layer is then formed over the charge trapping layer and a high-dielectric material layer (e.g., alumina, Hafnium oxide, and a Hi-K material layer) is formed over the second dielectric layer, thus forming for example, an ONOA stack. The stack is then removed (e.g., using a local interconnect mask), to define a local interconnect (LI) opening in the array source line region of the wafer. The wafer is then cleaned (e.g., using an HF rinse), and a polysilicon layer is then formed over the wafer filling the LI opening with polysilicon.

The poly layer and ONOA stack are then selectively removed to concurrently define wordline and select drain gate structures in bitline contact regions, and select source gate structures and source line structures in source line regions of the wafer. An N− ion species is then implanted through the openings in the polysilicon layer and the high-dielectric material layer to form the drain regions in the bitline contact regions and the source line regions of the wafer. Sidewall spacers are then formed in bitline contact region and source line contact regions, an array ion species is implanted in the bitline contact regions, and a silicide layer is then formed in the polysilicon layer in the core region to concurrently form a conductive layer for memory cell gate, bitline, wordline, the select gate, and the source line structure contacts of the wafer.

In another aspect of the invention, after forming the high-dielectric (e.g., alumina) layer, and before the LI opening is etched, a first (e.g., thin) poly layer may be formed over the wafer to protect a gate oxide formed in the periphery region. After the cleaning, a second poly layer is then formed over the first poly layer to fill the ARVSS opening to the substrate.

In yet another aspect the VSS implant joins the ARVSS structure to a medium density drain (MDD) region.

In still another aspect the local interconnect opening is etched using a local interconnect mask in the array source line (ARVSS) region.

In one aspect of the present invention, the multi-layer dielectric-charge trapping-dielectric stack overlying the substrate comprises a first oxide layer overlying the substrate of the wafer, a nitride layer overlying the first oxide layer, and a second oxide layer overlying the nitride layer, or another such multi-layer ONO type stack.

The invention thus facilitates the manufacture of scaled memory devices requiring fewer processing steps than that of a conventional method. Beneficially, the fabrication method of the present invention avoids etching the STI, which is particularly difficult to remove conventionally to the depth required. Further, the fabrication method of the present invention mitigates device failures due to source line connection failures from inadequate silicidation in a conventional source line trench opening. In addition, the fabrication method of the present invention advantageously provides a flat conductive silicide layer concurrently formed on a poly layer above the ONO stack together with the formation of the memory cell gate, bitline, wordline, the select gate, and the source line structure contacts of the wafer. Thus, a simpler fabrication process is implemented.

To the accomplishment of the foregoing and related ends, the following description and annexed drawings set forth in detail certain illustrative aspects and implementations of the invention. These are indicative of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIGS. 3A–3C are partial side elevation views in section, such as in FIG. 1 at A–A' along a bitline, at B–B' along an STI region between bitlines, and at C–C' along an array source line, respectively, illustrating further details of the memory device of FIGS. 1, 2A and 2B formed in a semiconductor wafer according to a conventional method;

FIGS. 4A and 4B are partial side elevation views in section, such as in FIG. 1 at A–A' along a bitline, and at C–C' along an array source line, respectively, illustrating further details of a NAND flash memory device formed in a semiconductor wafer in accordance with one or more aspects of the present invention;

FIGS. 6A–6J are partial side elevation views in section along a bitline, such as at A–A' of FIG. 1, illustrating exemplary steps in the formation of an array source line structure within a polysilicon layer in the core region of the NAND flash memory device of FIGS. 4A and 4B in accordance with the method of FIG. 5A; and FIGS. 7A–7J are partial side elevation views in section along a bitline, such as at A–A' of FIG. 1, illustrating exemplary steps in the formation of an array source line structure within a polysilicon layer in the core region of the NAND flash memory device of FIGS. 4A and 4B in accordance with the method of FIG. 5B.

DETAILED DESCRIPTION OF THE INVENTION

Figure 1:
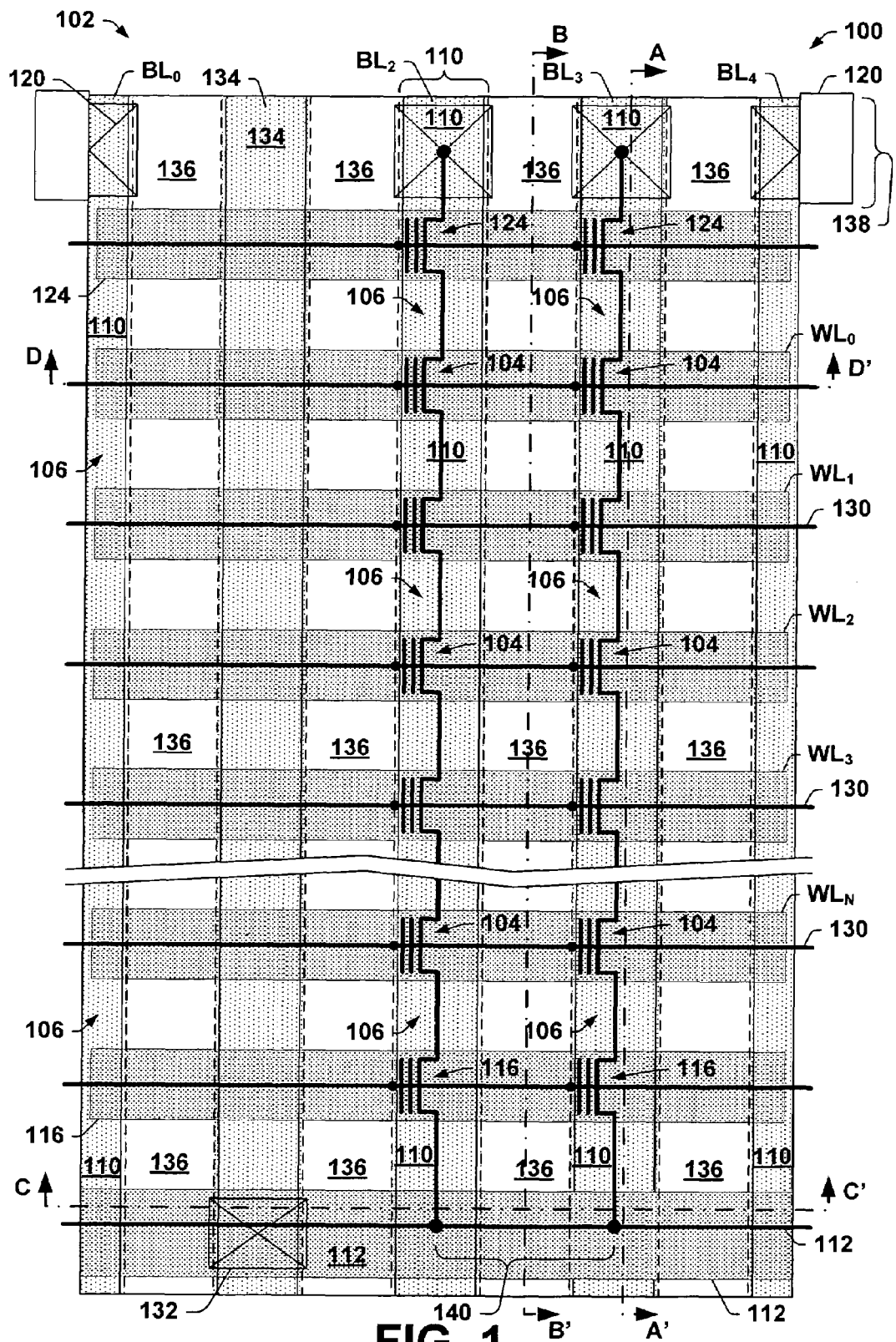
FIG. 1 is a top plan view of the core region of a NAND flash memory device comprising a NAND array such as may be fabricated in accordance with one or more aspects of the invention.

One or more implementations of the present invention will now be described with reference to the drawings, wherein like reference numerals are used to refer to like elements throughout, and wherein the various structures are not necessarily drawn to scale. The present invention relates to a systems and methods for fabricating an improved flash memory array source line structure (ARVSS), which may be used for a common source interconnection means in NAND flash memory devices illustrated and described below. In addition, the methods of the present invention provide for the concurrent fabrication of an ARVSS structure, the wordlines, and the select gate transistor structures in the core region of a memory device, for example, as may be useful in NAND type memory architectures. It will be appreciated that the invention may be employed in various types of operation scheme, such as FN programming, FN erase, channel hot electron programming and hot hole erase, or others, and that the invention is not limited to the implementations specifically illustrated and described herein.

Referring initially to FIG. 1, the exemplary figure illustrates an exemplary core region or portion of a NAND flash memory device 100 comprising a NAND array 102 such as may be fabricated in accordance with one or more aspects of the invention. The exemplary NAND array 102 includes one or more cells 104, series interconnected source to drain within active regions 106 along columns of conductive (e.g., metal, M1 layer) bitlines (e.g., $BL_0$ thru $BL_3$) 110, for example at section A–A', the source end of the each bitline 110 coupled to a conductive array common source line ARVSS 112, for example at section C–C', by a select source gate (transistor) 116. The drain end of each bitline 110 column is coupled to a bitline contact 120 via a select drain gate (transistor) 124, while individual cells 104 within an associated bitline 110 are selected via rows of wordlines (e.g., $WL_0$ thru $WL_N$) 130, for example at section D–D', connected to the gate of each memory cell 104. A NAND array bitline BL 110, for example, may comprise a series string of 32 multi-bit cells 104 between the drain select gate 124 and the source select gate (transistor) 116.

The conductive array common source line ARVSS 112, comprising, for example, a silicide layer, has an ARVSS contact 132 for connection to a common ground (not shown) via a global VSS interconnection on the M2 metal layer. Further, a metal VSS line 134 via the ARVSS contact 132, connects to the array source line ARVSS 112. ARVSS 112 supplies, for example, 128 bitline common source segment interconnections. Between the columns of bitlines BL 110, are column regions of shallow trench isolation (STI) 136 (e.g., oxide, dielectric material) at section B–B' to isolate and separate the bitline active areas 106 and the bitlines 110 associated with the column of memory cells 104 of the NAND array 102.

In a conventional fabrication method, the conductive array source line ARVSS 112 further utilizes a local interconnect (LI) 140 that electrically interconnects segments of the ARVSS 112 between adjacent bitlines 110 to form a continuous array source line ARVSS 112. However, the conventional array source line may have a highly contoured shape that makes this structure longer and thus more resistive, and may have occasional discontinuities, which occur because the CoSi (cobalt silicide) sometimes fails to form on the sidewalls of the trench etched deep into the STI 136 regions. (reference 324 of FIG. 3B)

The array source line structure 112, the wordlines 130, and a bitline contact region 138 for the bitline contacts 120 of the NAND array 102 of FIG. 1, may be fabricated concurrently in accordance with the various methods of the present invention as will be illustrated in further detail infra. An individual flash cell 104 may thus be selected via application of appropriate voltages to an associated word line and a bit line drain select gate 124, and a bitline source select gate 116 bounding the cell 104 of interest. Although the exemplary NAND array 102 of FIG. 1 is illustrated in the present example, it should be understood that one or more aspects of the present invention are also applicable to other array types and architectures.

Figure 2A:
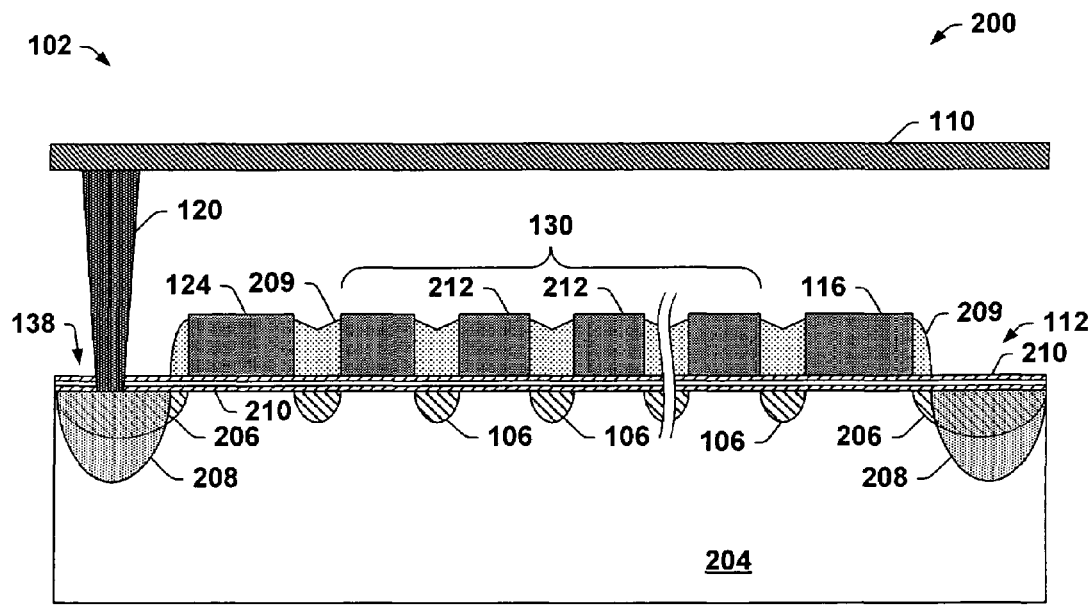
FIG. 2A is a partial side elevation view in section, such as in FIG. 1 at A–A' along a bitline illustrating a NAND flash memory device formed in a semiconductor wafer according to a conventional method.
Figure 2B:
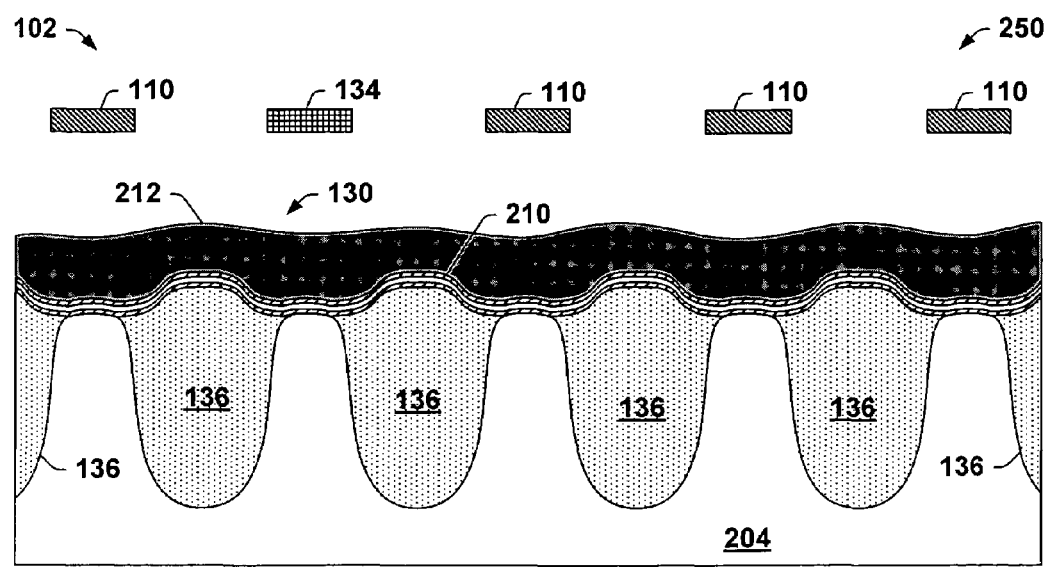
FIG. 2B is a partial side elevation view in section, such as in FIG. 1 at D–D' along a wordline illustrating a NAND flash memory device formed in a semiconductor wafer in accordance with one or more aspects of the present invention.

FIG. 2A illustrates an exemplary bitline cross section A–A' 200, cut along a bitline column 110 such as that of the NAND array 102 of flash memory device 100 of FIG. 1 formed in a semiconductor wafer according to a conventional method. Similarly, FIG. 2B illustrates an exemplary wordline cross section at D–D' 250, cut along a wordline row 130 such as that of the NAND array 102 of flash memory device 100 of FIG. 1. The NAND array 102 comprises, for example, 32 wordlines 130 of associated memory cells 104. The wordlines 130 of memory cells 104 along the bitline 110 of section A–A' 200 are supplied a VSS common ground via the array source line structure 112, when selected by select source gate (SSG) transistor 116. At the other end of the bitline 110 of section A–A' 200, the wordlines 130 of memory cells 104, are accessed by select drain gate (SDG) transistor 124 via the bitline contact region 138, bitline contact 120, and the M1 bitline 110.

When data is read from the wordlines 130, the select drain gate transistor 124 and select source gate transistor 116 are selected. The current flows through the drain contact and the select drain gate 124 into the memory cell array from the metal bitline 110. After passing the select source gate 116, the current eventually flows to the ARVSS 112. ARVSS 112 accumulates the current from all the bitlines in the selected block of memory. During programming of a cell along wordlines 130, the select source gate 116 is turned off while the select drain gate 124 is turned on. ARVSS 112 is usually grounded at this time, however, there is another case or method in which ARVSS is used to supply a bias to the diffusion 206 of the select source gate 116 in order to provide a back bias to the select source gate 116 to ensure that the current is shut off. During erase, the ARVSS is left floating. Thus, conventional operational schemes may be used in association with the structures formed according to the present invention.

The NAND array 102 of FIGS. 2A and 2B comprises a P-type substrate 204 with a source and drain active region 106 typically doped with a first implant 206 of an n-type impurity (e.g., phosphorus, an n– dopant), while the bitline contact region 138, and the array common source line ARVSS 112, may be typically doped with an additional second implant 208 of an n-type impurity (e.g., phosphorus, an n+ dopant) using a side wall spacer 209. The NAND array 102 further comprises a charge trapping layer such as a typical ONO layer or stack 210 comprising, for example, a silicon nitride layer located between upper and lower $SiO_2$ layers. A polysilicon gate 212 (e.g., 32 wordlines 130) overlies the upper oxide layer of the ONO stack 210, and may be doped with an n-type impurity.

As shown in section at D–D' 250 of FIG. 2B, shallow trench isolation (STI) regions 136 separate and isolate bitlines 110 and active regions 106 of the NAND array 102.

Figure 3C:
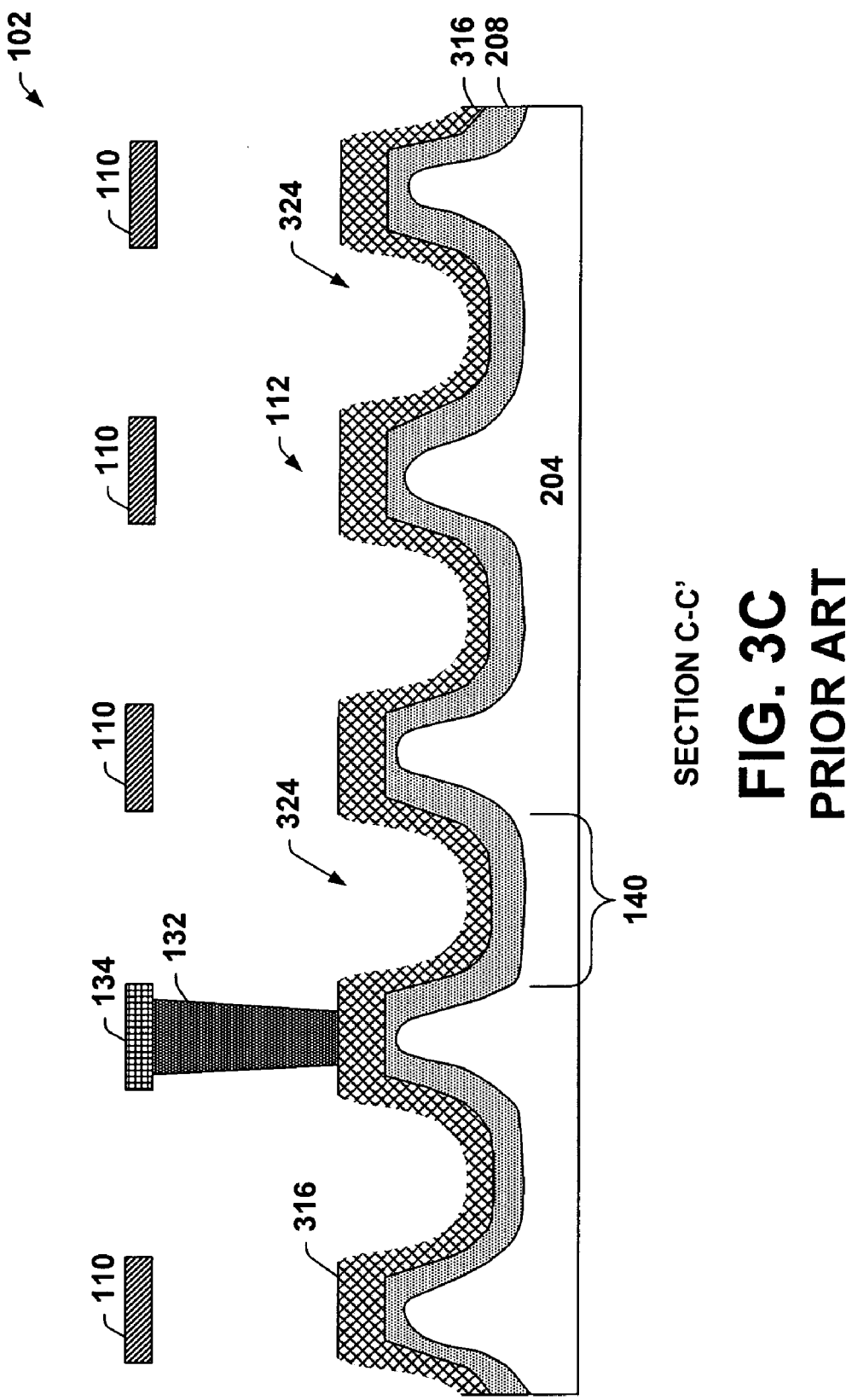

FIGS. 3A–3C illustrate further details of conventional array source line processing in the fabrication of the NAND flash memory device of FIGS. 1, 2A and 2B, at section A–A' 300 along a bitline, at section B–B' 301 along an STI region between bitlines, and at section C–C' 302 along an array source line, respectively, of the NAND flash memory device formed in a semiconductor wafer using conventional processing methods. The conventional structures illustrated in FIGS. 3A–3C are similar to that of FIGS. 2A and 2B, and as such need not be described again in detail for the sake of brevity. The structures and formations of FIGS. 3A–3C may be divided into a first bitline BL contact portion 304, an array VSS or ARVSS region 306, and a second bitline contact portion 308 extending to the right of the ARVSS region 306 of a substrate 204.

In addition to those structures and features previously described, the conventional array source line processing of FIGS. 3A–3C may include a polysilicon gate or wordline structure (e.g., 212, 116, 124, 130) comprising an $Al_2O_3$ alumina dielectric layer 312 formed over the ONO layer 210, a polysilicon layer 314, and a conductive CoSi or silicide layer 316 formed in the polysilicon layer 314. The conductive silicide layer 316 is used to electrically interconnect between the memory cell gates for the wordlines and along the array source line 112 of the ARVSS region 306. The conductive silicide layer 316 is also used to provide a better electrical connection between the underlying implanted regions 206 and 208 and the VSS contact 132 of FIGS. 1 and 3C, for example.

In the conventional array source line processing of the array source line ARVSS 112 of FIGS. 1, 2A, 2B, and 3A–3C, a local interconnect (LI) mask 322 is typically needed to etch a trench or opening 324 through the STI 136 to the underlying second implant region 208 in the ARVSS region 306. Thereafter, the conductive silicide layer 316 is formed at the bottom of the trench opening 324 in the second implant region 208 of the polysilicon substrate 204 to form a local interconnect (LI) 140 between adjacent array source line 112 segments of adjacent bitlines 110. However, formation of the silicide 324 may be difficult at this conventional depth, and to the lateral sidewalls of the trench as disconnections of this local interconnect are common in the conventional method.

In addition, the cross sections 301 of FIG. 3B, and 302 of FIG. 3C, respectively, further illustrate that in the conventional method the etched opening 324 in the STI 136 forms a highly undulating surface for second implant region 208 and for the conductive silicide layer 316 of the array source line ARVSS 112. With the ARVSS 112 formed in this conventional manner, the effective length of the array source line 112 is long, and therefore the resistance of the line is relatively high. Further, careful placement of the LI mask 322 and other features associated with the formation of the array source line 112 may be needed to insure alignment to the select source gates 116.

Figure 5A:
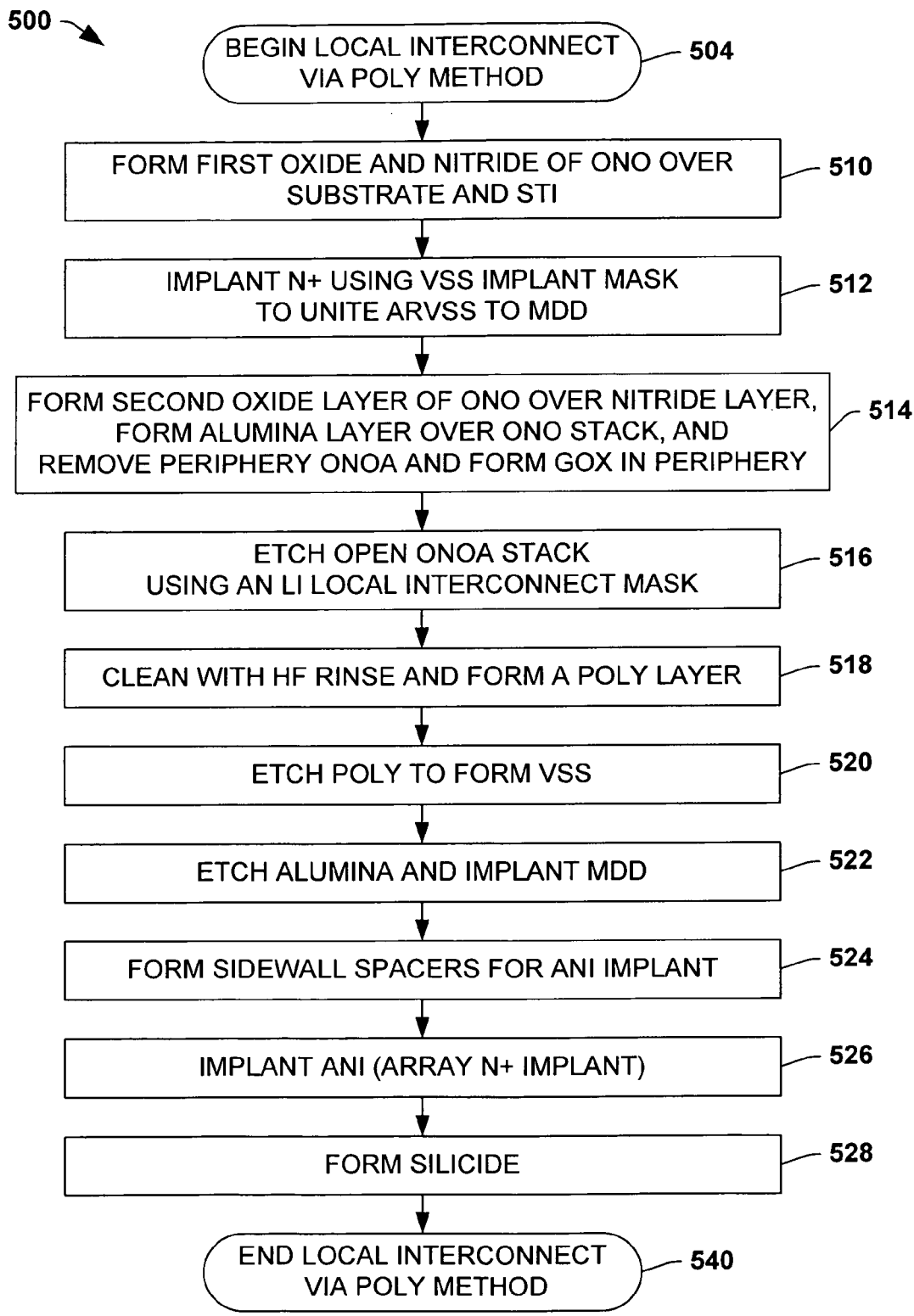
FIGS. 5A and 5B are flow diagrams illustrating exemplary methods of fabricating NAND type flash memory devices having array source line structures concurrently formed together with wordlines, and select gate structures within a polysilicon layer in the core region of a NAND flash memory device of FIGS. 4A and 4B in accordance with the present invention.
Figure 5B:
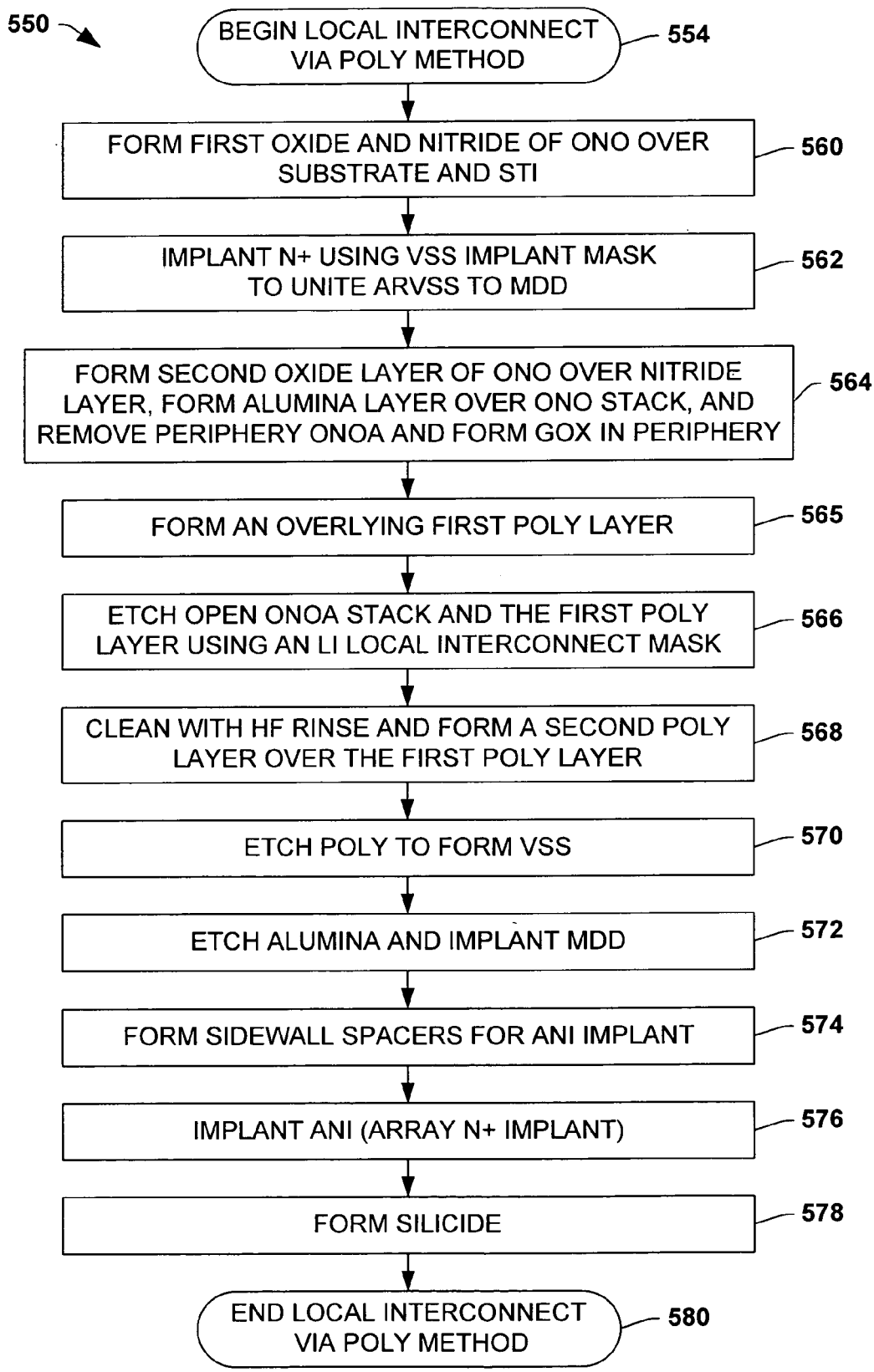

In accordance with the present invention, a method of formation of an array source line in a NAND flash memory device is presented. FIGS. 4A and 4B illustrate an exemplary implementation of the structure, while FIGS. 5A and 5B illustrate two exemplary methods 500 and 550, respectively, of the formation of those structures in accordance with the present invention. Although many elements of FIGS. 4A and 4B are similar to those previously described in the context of the prior art FIGS. 2A and 3A–3C, the use of FIGS. 1 and 2B may serve to illustrate common elements of both the prior art and certain aspects of the present invention.

For example, FIGS. 4A and 4B illustrate exemplary array cross sections at A–A' 400 along a bitline, and at C–C' 430 along an array source line, respectively, such as array 102 of the NAND flash memory device 100 of FIG. 1 such as may be formed in a semiconductor wafer in accordance with one or more aspects of the present invention.

FIG. 4A, for example, illustrates that in the formation methods of the present invention, an array source line ARVSS 112 may be formed simultaneously with the select source gate SSG 116, the select drain gate SDG 124, and the wordlines 130 above a substrate 404, the array 102 divided into a first bitline (BL) contact region 405, an ARVSS region 406, and a second BL contact region 408.

Cross section 430 of FIG. 4B, further illustrates that the STI 409 does not need to be etched through to the underlying substrate 404, but that the array source line 112 is instead formed entirely above the STI 409 and substrate 404 comprising a silicide layer 410 formed within the gate poly layer 411. Thus, compared to conventional processing methods, the array source line 112 of the present invention has a greater likelihood of continuity between adjacent bitline 110 segments as a result of the formation of a more conductive flat structure in the ARVSS region 406, comprising a silicide layer 410 formed within the gate poly layer 411 overlying the STIs 409 and the substrate 404 of array 102.

The NAND array 102 of FIGS. 4A and 4B may comprise, for example, multiple wordlines 130 (e.g., 32 wordlines) of associated memory cells 104. The wordlines 130 of memory cells 104 along the bitline 110 of section A–A' 400 are supplied a VSS common ground via the array source line structure 112, when selected by select source gate (SSG) transistor 116. At the other end of the bitline 110 of section A–A' 400, the wordlines 130 of memory cells 104, are accessed by select drain gate (SDG) transistor 124 via the bitline contact region 138, bitline contact 120, and the M1 bitline 110.

The NAND array 102 of FIGS. 4A and 4B may comprise a P-type substrate 404 with a source and drain active region 106 typically doped with a first implant 412 of an n-type impurity (e.g., phosphorus, an n– dopant), while the bitline contact region 138, and the array common source line ARVSS 112, may be typically doped with an additional second implant 416 of an n-type impurity (e.g., phosphorus, an n+ dopant) using a side wall spacer 418. The NAND array 102 further comprises a charge trapping layer such as a typical ONO layer or stack 420 comprising, for example, a silicon nitride layer located between upper and lower $SiO_2$ layers.

In the array source line processing of FIGS. 4A–4B the polysilicon gate or wordline structures (e.g., 116, 124, 130) overlying the ONO stack 420, may further comprise a high-dielectric material layer 422 (e.g., $Al_2O_3$ alumina, hafnium oxide) formed over the ONO stack 420, a polysilicon layer 411 that may be doped with an n-type impurity, and a conductive CoSi or silicide layer 410 formed in the polysilicon layer 411. The conductive silicide layer 410 is used to electrically interconnect between the memory cell gates for the wordlines and along the array source line 112 of the ARVSS region 406. The conductive silicide layer 410 is also used to provide a better electrical connection between the underlying implanted regions 412 or 416 and the VSS contact 132 of FIGS. 1, 3C, and 4B, for example. The polysilicon layer 411 extends through an opening 426 in the ONOA stack to the n-doped ARVSS regions 416 that will unite the array source line 112 to the n-doped active regions 412 of the select source gate SSG transistors 116.

In FIGS. 5A and 5B, exemplary methods 500 and 550 are illustrated for fabricating an array source line structure concurrently formed together with wordlines, and select gate structures in the core region of a NAND flash memory device such as that of FIGS. 1, 4A, and 4B in accordance with one or more aspects of the present invention. Although the methods 500 and 550 are illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. In one example, the methods 500 and 550 or variants thereof, may be used in manufacturing NAND type memory devices and their associated structures, as illustrated and described below with respect to FIGS. 1, 4A, 4B, 6A–6J, and 7A–7J.

Method 500 of FIG. 5A, for example, begins at 504, wherein a first oxide layer and a nitride layer of a multi-layer dielectric-charge trapping-dielectric stack such as a multi-layer ONO stack 420 is formed at 510 overlying a substrate 404 and an STI (e.g., 136 of FIGS. 1 and 2B or 409 of FIG. 4B), using standard processes. Any appropriate process steps and materials may be employed in forming the ONO layers at 510, including oxidation and/or deposition techniques as are known. The layers formed at 510 can be any other dielectric-charge trapping-dielectric multi-layer stack, including but not limited to an ONO stack 420. In the case of oxide dielectrics, any of the oxide layers can include nitride or other dopants for optimal device and reliability performance. In addition, the nitride layer can be rich in Si, N, and/or dopants such as oxygen to facilitate enhanced device performance and reliability performance. The layers of the completed multi-layer ONO stack 420 overlying the substrate may, for example, comprise a first oxide layer overlying the substrate of the wafer, a nitride layer overlying the first oxide layer, and a second oxide layer overlying the nitride layer, or another such multi-layer ONO type stack 420.

At 512, a first implant is accomplished in the ARVSS region 406 using an N+ ion dopant implanted through the first oxide and nitride layers of the ONO stack 420, for example, using a VSS implant mask. After subsequent thermal cycling, this n-doped ARVSS implant 416 will unite the array source line 112 to the source/drain active regions 106 of the select source gate SSG transistors 116.

At 514, the second or upper oxide layer of the ONO stack 420 is formed over the nitride layer and an alumina $Al_2O_3$ (A) layer 422 is subsequently formed over the second oxide layer in the core region of the array, thus forming an ONOA stack (e.g., 420 and 422). Subsequently, the ONOA stack (420 and 422) is removed from the periphery (not shown) and a gate oxide layer (GOX) (not shown) may be formed by a conventional thermal oxide in the periphery region.

At 516 an opening 426 is etched in the ONOA stack (e.g., 420 and 422) down to the substrate 404 in the ARVSS region 406, for example, using a local interconnect mask.

At 518 the surface of the device 100 is cleaned, for example, using an HF rinse and a layer of polysilicon 411 is deposited. Because the native oxide needs to be removed, and the gate oxide is exposed, the gate oxide loss in the periphery should be taken into account to control the oxide thickness. At 520, selective portions of the polysilicon 411 are etched to form the VSS.

At 522, the alumina layer 422 is also etched down to the ONO layer to define the gate structures (e.g., 116, 124, 130) and the array source line structure 112. Then, dopants (e.g., MDD n− type) are implanted 412 through the ONO stack 420 in the source/drain active regions 106. At 524 sidewall spacers 418 are formed to guide a subsequent array N+ implant (ANI) 428, implanted at 526. Thereafter, a CoSi layer 410 is formed at 528 to provide a relatively flat, and thus shorter and more conductive array source line ARVSS 112 on polysilicon 411 between adjacent ARVSS regions 406 of adjacent bitlines 110. In a conventional method, these adjacent bitline ARVSS regions 406 would be joined by a local interconnect LI 140 having a highly contoured and thus longer path, that may require deep STI etching and be subject to a high rate of discontinuity failures.

Method 550 of FIG. 5B is similar to that of method 530 of FIG. 5A, and as such need not be completely described again for the sake of brevity. Method 550, for example, further adds a first (e.g., thin) polysilicon layer deposition at step 565 after removing the periphery ONOA stack (e.g., 420 and 422) and forming the gate oxide GOX layer (not shown) in the periphery region (not shown) of step 514 of FIG. 5A. At 566, the etch of step 516 to form the VSS, further comprises etching the first polysilicon layer. At 568, the cleaning step of 518 is again accomplished as before to remove the native oxide, however, because the gate oxide is now covered and protected from the HF rinse by the first polysilicon layer in the periphery region, the gate oxide loss in the periphery is not a concern in this method aspect of the invention. To obtain an ideal thickness of the poly, Step 568 further comprises a second polysilicon layer deposition over the first polysilicon layer. Thereafter, steps 570–580 of FIG. 5B proceed as before in steps 520–540 of FIG. 5A, wherein the two polysilicon layers may be processed and considered as one layer.

FIGS. 6A–6J illustrate cross sectional views at A–A' of FIG. 1 along a bitline 110, of the fabrication of an exemplary array source line structure 112 within a polysilicon layer (e.g., 411) in the core region of a NAND flash memory array 602 similar to that of 102 of FIGS. 1, 4A and 4B in accordance with the method 500 of FIG. 5A. The method of FIGS. 6A–6J illustrates exemplary formations within a substrate 604 of the array 602 in a first BL contact region 605 an ARVSS region 606, and a second BL contact region 608.

FIG. 6A, for example, illustrates the formation of a first oxide layer 604 and a nitride layer 608 of a multi-layer dielectric-charge trapping-dielectric stack such as a multi-layer ONO stack 620 over the substrate 604 and an STI (e.g., 136 of FIGS. 1 and 2B or 409 of FIG. 4B), in the semiconductor array 602, using standard processes.

In FIG. 6A, a first oxide layer 610 and a nitride layer 611 of an exemplary multilayer ONO stack 620 is initially formed over the substrate 604 and the STI (e.g., 136 of FIGS. 1 and 2B or 409 of FIG. 4B) of array 602 in accordance with step 510 of the method of FIG. 5A. The layers of the multilayer ONO stack 620 may comprise, for example, a first oxide layer 610, such as $SiO_2$ formed over the substrate 604 and the STI 136, as well as a nitride layer 611 formed over the first oxide 610, and second oxide layer 612 formed over the nitride layer 611. For example, these materials may be formed by individual deposition and/or oxidation steps, generally indicated by 614. As discussed previously, the multilayer stack may comprise other combinations of layers and materials suitable for a SONOS NAND type array, such as in FIGS. 1, 4A and 4B.

In FIG. 6B, a dopant, such as As, P, or another n-type ion species is then implanted, as in method step 512, for example, using a VSS implantation mask and VSS implantation process 616, implanting into the substrate 604 through the first oxide 610 and nitride layers 611 in the ARVSS region 606, forming an N+ implant region 618 in the substrate 604 of array 602 of FIG. 6B. Due to subsequent thermal cycling, the implant region 618a is allowed to diffuse sufficiently to form implant region 618 that will later unite the array source line ARVSS 112 to the source/drain active regions 106 (MDD) of the source select gate transistors 116.

In FIG. 6C, the upper oxide layer (e.g., $SiO_2$) 612 and an overlying high-dielectric (e.g., $Al_2O_3$ Alumina) layer 622 is then formed by another oxide and/or deposition process 624 as in method step 514 of the method of FIG. 5A. Although not shown, the ONOA stack (e.g., 620 and 622) is then removed from the periphery region (not shown), and a gate oxide layer (GOX) (not shown) is subsequently formed in the periphery.

In FIG. 6D, an opening 626 is etched 627 in the ONOA stack (e.g., 620 and 622) down to the substrate 604 in the ARVSS region 606, for example, using a local interconnect mask, and as discussed in connection with step 516 of FIG. 5A.

In FIG. 6E, and as discussed in step 518 of FIG. 5A, the surface of the wafer of array 602 is cleaned, for example, using an HF rinse and a layer of polysilicon 628 is applied by a deposition process 630. The polysilicon layer 628 generally fills the opening 626 down to the substrate 604 to later provide the means of uniting the array source line ARVSS (e.g., 112) to the SSG transistor (e.g., 116) active (source/drain) regions (e.g., 106). During the cleaning, because the native oxide (not shown) needs to be removed from the surface, and the gate oxide (not shown) is exposed, the gate oxide loss in the periphery should be taken into account to control the oxide thickness. The deposition of the polysilicon layer may be accomplished using chemical vapor deposition (CVD) processes or other such process that are known, followed by a patterning thereof.

In FIG. 6F, and as discussed in connection with step 520, selective portions of the polysilicon layer 628 are then removed in an etch process 632 to form or define the ARVSS structure 634 in the ARVSS region 606, and a bitline contact opening 636 in the first BL contact region 605 and the second BL contact region 608 (opening not shown), for example.

In FIG. 6G, and as discussed in step 522, selective portions of the alumina layer 622 are then also removed by an etch process 638 down to the ONO stack 620 to further define the gate structures (e.g., 116, 124, 130) and the array source line structure 634 or 112. Then, an n− implant 640 is formed, wherein dopants (e.g., MDD n− type) are implanted by an implantation process 642 through the ONO stack 620 into the source/drain active regions 106 and the bitline contact opening 636.

In FIG. 6H, and as discussed in connection with step 524 sidewall spacers 646 are formed by an insulative deposition process 648 to guide a subsequent array implantation.

In FIG. 6I, and as described at 526, an array N+ implant (ANI) 650 is provided through the exposed BL opening 636 in the BL contact regions (e.g., 605, 608) by an array N+ implantation (ANI) process 652.

Finally, in FIG. 6J, and as discussed in connection with step 528, a CoSi layer 654 is formed by a silicidation process 656 to provide a relatively flat, and thus shorter and more conductive array source line ARVSS 634 in polysilicon 628, effectively joining adjacent ARVSS regions 606 of adjacent bitlines 110. By contrast, in a conventional method, these adjacent bitline ARVSS regions 606 would be joined by a local interconnect LI 140 having a highly contoured and thus longer path, that may require deep STI etching and may be subject to a high rate of discontinuity failures because the CoSi occasionally fails to form on the sidewalls of the deep STI trench.

Thus, in accordance with the methods of the present invention, a local interconnect is formed in and using a polysilicon layer simultaneously formed with the selection gates and wordlines. Advantageously, the improved interconnect method becomes possible entirely formed above the ONO layer (e.g., 620, 420), the STIs (e.g., 409) and the substrate (e.g., 604, 404), thereby eliminating deep STI etching and filling process steps.

In another similar implementation of the present invention, FIGS. 7A–7J illustrate other cross sectional views at A–A' of FIG. 1 along a bitline 110, of the fabrication of an exemplary array source line structure 112 within a polysilicon layer (e.g., 411) in the core region of a NAND flash memory array 702 similar to that of 102 of FIGS. 1, 4A and 4B in accordance with the method 550 of FIG. 5B. The method of FIGS. 7A–7J illustrates exemplary formations within a substrate 704 of the array 702 in a first BL contact region 705 an ARVSS region 706, and a second BL contact region 708.

FIG. 7A, for example, illustrates the formation of a first oxide layer 704 and a nitride layer 708 of a multi-layer dielectric-charge trapping-dielectric stack such as a multilayer ONO stack 720 over the substrate 704 and the STI (e.g., 136 of FIGS. 1 and 2B or 409 of FIG. 4B) in the semiconductor array 702, using standard processes.

In FIG. 7A, a first oxide layer 710 and a nitride layer 711 of an exemplary multilayer ONO stack 720 is initially formed over the substrate 704 and the STI 136 of array 702 in accordance with step 560 of the method of FIG. 5B. The layers of the multilayer ONO stack 720 may comprise, for example, a first oxide layer 710, such as $SiO_2$ formed over the substrate 704 and STI 136, as well as a nitride layer 711 formed over the first oxide 710, and second oxide layer 712 formed over the nitride layer 711. For example, these materials may be formed by individual deposition and/or oxidation steps, generally indicated by 714. As discussed previously, the multilayer stack may comprise other combinations of layers and materials suitable for a SONOS NAND type array, such as in FIGS. 1, 4A and 4B.

In FIG. 7B, a dopant, such as As, P, or another n-type ion species is then implanted, as in method step 562, for example, using a VSS implantation mask and VSS implantation process 716, implanting into the substrate 704 through the first oxide 710 and nitride layers 711 in the ARVSS region 706, forming an N+ implant region 718 in the substrate 704 of array 702 of FIG. 7B. Due to subsequent thermal cycling, the implant region 718a is allowed to diffuse sufficiently to form implant region 718 that will later unite the array source line ARVSS 112 to the source/drain active regions 106 (MDD) of the source select gate transistors 116.

In FIG. 7C, the upper oxide layer (e.g., $SiO_2$) 712 and an overlying Hi-K material layer 722 (e.g., $Al_2O_3$ Alumina (A), or Hafnium oxide) is then formed by another oxide and/or deposition process 724, the ONOA stack (e.g., 720 and 722) is then removed from the periphery region (not shown), and a gate oxide GOX layer (not shown) is formed in the periphery region as in method step 564 of the method of FIG. 5B. Further, a first polysilicon layer 725 is then formed by another deposition process 725a overlying the Hi-K material layer 722 as in method step 565 of the method of FIG. 5B. The first polysilicon layer 725 provides protection for the gate oxide layer in the periphery during a later cleaning operation.

In FIG. 7D, an opening 726 is etched 727 through the first polysilicon layer 725 and the ONOA stack (e.g., 720 and 722) down to the substrate 704 in the ARVSS region 706, for example, using a local interconnect mask, and as discussed in connection with step 566 of FIG. 5B.

In FIG. 7E, and as discussed in step 568 of FIG. 5B, the surface of the wafer of array 702 is cleaned to remove the native oxide, for example, using an HF rinse. In this implementation of the method 550 and the cleaning process of step 568, however, because the gate oxide is now covered and protected from the HF rinse by the first polysilicon layer 725, the gate oxide loss in the periphery is not a concern. To obtain an ideal thickness of the polysilicon layer, FIG. 7E and method step 568 further comprises the addition of a second polysilicon layer 728 applied by a deposition process 730.

Accordingly, a harmless conformal dip 731 may occur during the formation of the second polysilicon layer 728 in this implementation of method 550, because a thinner layer of polysilicon need only be applied after the etch of the underlying first polysilicon layer 725 and the ONOA layers (e.g., 720 and 722). The second polysilicon layer 728 generally fills the opening 726 down to the substrate 704 to later provide a means of uniting the array source line ARVSS (e.g., 112) to the SSG transistor (e.g., 116) active (source/drain) regions (e.g., 106). The deposition of either the first or second polysilicon layers 725 and 728, respectively, may be accomplished using chemical vapor deposition (CVD) processes or other such process that are known, followed by a patterning thereof. Hereinafter, a combination of the first and second polysilicon layers 725 and 728, respectively, may also be collectively referred to and designated as a single polysilicon layer 729.

In FIG. 7F, and as discussed in connection with step 570, selective portions of the polysilicon layer 729 is then removed in an etch process 732 to form or define the ARVSS structure 734 in the ARVSS region 706, and a bitline contact opening 736 in the first BL contact region 705 and the second BL contact region 708 (opening not shown), for example.

In FIG. 7G, and as discussed in step 572, selective portions of the alumina layer 722 are then also removed by an etch process 738 down to the ONO stack 720 to further define the gate structures (e.g., 116, 124, 130) and the array source line structure 734 or 112. Then, an n– implant 740 is formed, wherein dopants (e.g., MDD n– type) are implanted by an implantation process 742 through the ONO stack 720 into the source/drain active regions 106 and the bitline contact opening 736.

In FIG. 7H, and as discussed in connection with step 574 sidewall spacers 746 are formed by an insulative deposition process 748 to guide a subsequent array implantation.

In FIG. 7I, and as described at 576, an array N+ implant (ANI) 750 is provided through the exposed BL opening 736 in the BL contact regions (e.g., 705, 708) by an array N+ implantation (ANI) process 752.

Finally, in FIG. 7J, and as discussed in connection with step 578, a CoSi layer 754 is formed by a silicidation process 756 to provide a relatively flat, and thus shorter and more conductive array source line ARVSS 734 in polysilicon 729, that effectively joins adjacent ARVSS regions 706 of adjacent bitlines 110. By contrast, in a conventional method, these adjacent bitline ARVSS regions 706 would be joined by a local interconnect LI 140 having a highly contoured and thus longer path, that may require deep STI etching and may be subject to a high rate of discontinuity failures because the CoSi occasionally fails to form on the sidewalls of the deep STI trench.

Thus, in accordance with the methods of the present invention, a local interconnect is formed in a polysilicon layer simultaneously formed together with the selection gates and wordlines. Accordingly, forming the array source line simultaneously with the selection gates and wordlines may also minimize process steps or allow easier manufacturing. Advantageously, the improved interconnect method becomes possible formed entirely above the substrate (e.g., 704, 404), generally above the ONOA layer (e.g., 720 or 420, and 722 or 422), and the STIs (e.g., 409) thereby eliminating deep STI etching and inadequate or difficult filling process steps which may improve production yield.

Thereafter, the exemplary implementation of the methods of the present invention ends, after which further process steps (not shown) may be performed to fabricate other structures and devices of the wafer, followed by metallization and other back end processing.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes", "having", "has", "with", or variants thereof are used in either the detailed description or the claims, such terms are intended to be inclusive in a manner similar to the term "comprising."

What is claimed is:

1. A method of fabricating an array source line structure in a wafer of a NAND flash memory, comprising:

forming a first dielectric layer and a charge trapping layer of a multi-layer dielectric-charge trapping-dielectric stack over a substrate and an STI of the wafer;

implanting an ion species in an array source line region, to unite the array source line structure to a source/drain region;

forming a second dielectric layer over the charge trapping layer of the multi-layer dielectric-charge trapping-dielectric stack, and forming a high-dielectric material layer over the second dielectric layer;

removing the high-dielectric material layer and the multi-layer dielectric-charge trapping-dielectric stack in the array source line region, thereby defining a local interconnect opening in the multi-layer dielectric-charge trapping-dielectric stack and the high-dielectric material layer in the array source line region of the wafer;

forming a polysilicon layer over the wafer, thereby filling the local interconnect opening with polysilicon;

selectively removing the polysilicon layer and the high-dielectric material layer, thereby concurrently defining wordline and select drain gate structures in bitline contact regions, and select source gate structures and source line structures in source line regions of the wafer; and implanting an ion species through the openings in the polysilicon layer and the high dielectric material layer to form the source/drain regions in the bitline contact regions and the source line regions of the wafer, wherein the source line structure formed in the source line region of the wafer is united with the source/drain regions of the select source gate structures.

2. The method of claim 1 further comprising depositing an insulative layer thereby forming sidewall spacers on the sidewalls of the gate structures in the bitline contact regions and filling between gate and array source line structures in source line regions of the wafer;

implanting an array ion species in the bitline contact regions; and forming a silicide layer in the polysilicon layer in a core region to concurrently form a conductive layer for memory cell gate, bitline, wordline, the select gate, and the source line structure contacts.

3. The method of claim 1 further comprising removing the ONOA stack from the periphery region and forming a gate oxide layer in the periphery region, after forming a second dielectric layer over the charge trapping layer of the multi-layer dielectric-charge trapping-dielectric stack, and forming a high-dielectric material layer over the second dielectric layer.

4. The method of claim 1, wherein the implanting an ion species in an array source line region, to unite the array source line structure to a source/drain region comprises implanting an N+ ion species in the array source line region, to unite the array source line structure to a medium density drain region.

5. The method of claim 1, wherein the implanting of the ion species in the array source line region is accomplished using a VSS implant mask, to unite the array source line structure to a medium density drain region.

6. The method of claim 1, wherein the high-dielectric material layer formed over the multi-layer dielectric-charge trapping-dielectric stack comprises one of Alumina, Hafnium oxide, and a Hi-K material layer.

7. The method of claim 1 further comprising cleaning the wafer before forming the polysilicon layer over the wafer.

8. The method of claim 7, wherein the cleaning of the wafer is accomplished using an HF rinse.

9. The method of claim 1, wherein the removing of the high-dielectric material layer and the multi-layer dielectric-charge trapping-dielectric stack in the array source line region is accomplished by an etch process and the use of a local interconnect mask to define the local interconnect opening.

10. The method of claim 1, wherein the local interconnect opening is used for interconnecting the array source line structure to a medium density drain region.

11. The method of claim 10, further comprising implanting an ion species through the openings in the polysilicon layer and the high dielectric material layer to form the medium density drain regions in the bitline contact regions and the source line regions of the wafer.

12. The method of claim 1, wherein the implanting the array ion species in the bitline contact regions comprises implanting an array N+ ion species in the bitline contact regions.

13. The method of claim 1, wherein the forming of the second dielectric layer over the charge trapping layer of the multi-layer dielectric-charge trapping-dielectric stack, and the high-dielectric material layer over the second dielectric layer comprises forming a single high-dielectric layer over the charge trapping layer of the multi-layer dielectric-charge trapping-dielectric stack, the single high-dielectric layer comprising one of Alumina, Hafnium oxide, and a Hi-K material layer.

14. The method of claim 1, wherein the implanting the ion species in an array source line region, and the removing the multi-layer dielectric-charge trapping-dielectric stack and the high-dielectric material layer are both accomplished using the same local interconnect mask.

15. A method of fabricating an array source line structure in a wafer of a NAND flash memory, comprising:

forming a first dielectric layer and a charge trapping layer of a multi-layer dielectric-charge trapping-dielectric stack over a substrate and an STI of the wafer;

implanting an ion species in an array source line region, to unite the array source line structure to a source/drain region;

forming a second dielectric layer over the charge trapping layer of the multi-layer dielectric-charge trapping-dielectric stack, and forming a high-dielectric material layer over the second dielectric layer;

forming a first polysilicon layer over the high-dielectric material layer to protect the gate oxide material in the periphery region;

removing the first polysilicon layer, the high-dielectric material layer, and the multi-layer dielectric-charge trapping-dielectric stack in the array source line region, thereby defining a local interconnect opening in the multi-layer dielectric-charge trapping-dielectric stack, the high-dielectric material layer, and the first polysilicon layer in the array source line region of the wafer;

forming a second polysilicon layer over the first polysilicon layer, thereby generally filling the local interconnect opening with polysilicon used to interconnect the array source line structure to a source/drain region;

selectively removing the first and second polysilicon layers and the high-dielectric material layer, thereby concurrently defining wordline and select drain gate structures in bitline contact regions, and select source gate structures and source line structures in source line regions of the wafer; and implanting an ion species through the openings in the first and second polysilicon layers and the high dielectric material layer to form the source/drain regions in the bitline contact regions and in the source line regions of the wafer, wherein the source line structure formed in the source line region of the wafer is united with the source/drain regions of the select source gate structures.

16. The method of claim 15 further comprising depositing an insulative layer thereby forming sidewall spacers on the sidewalls of the gate structures in the bitline contact regions and filling between gate and array source line structures in source line regions of the wafer;
   implanting an array ion species in the bitline contact regions; and
   forming a suicide layer in the polysilicon layer in a core region to concurrently form a conductive layer for memory cell gate, bitline, wordline, the select gate, and the source line structure contacts.

17. The method of claim 15 further comprising removing the ONOA stack from the periphery region and forming a gate oxide layer in the periphery region, before forming a first polysilicon layer over the high-dielectric material layer to protect the gate oxide material in the periphery region.

18. The method of claim 15, wherein the implanting an ion species in an array source line region, to unite the array source line structure to a source/drain region comprises implanting an N+ ion species in the array source line region, to unite the array source line structure to a medium density drain region.

19. The method of claim 15, wherein the implanting of the ion species in the array source line region is accomplished using a VSS implant mask, to unite the array source line structure to a medium density drain region.

20. The method of claim 15, wherein the high-dielectric material layer formed over the multi-layer dielectric-charge trapping-dielectric stack comprises one of Alumina, Hafnium oxide, and a Hi-K material layer.

21. The method of claim 15 further comprising cleaning the wafer before forming the polysilicon layer over the wafer.

22. The method of claim 21, wherein the cleaning of the wafer is accomplished using an HF rinse.

23. The method of claim 15, wherein the removing of the high-dielectric material layer and the multi-layer dielectric-charge trapping-dielectric stack in the array source line region is accomplished by an etch process and the use of a local interconnect mask to define the local interconnect opening.

24. The method of claim 15, wherein the local interconnect opening is used for interconnecting the array source line structure to a medium density drain region.

25. The method of claim 24, further comprising implanting an ion species through the openings in the polysilicon layer and the high dielectric material layer to form the medium density drain regions in the bitline contact regions and the source line regions of the wafer.

26. The method of claim 15, wherein the implanting the array ion species in the bitline contact regions comprises implanting an array N+ ion species in the bitline contact regions.

27. The method of claim 15, wherein the forming of the second dielectric layer over the charge trapping layer of the multi-layer dielectric-charge trapping-dielectric stack, and the high-dielectric material layer over the second dielectric layer comprises forming a single high-dielectric layer over the charge trapping layer of the multi-layer dielectric-charge trapping-dielectric stack, the single high-dielectric layer comprising one of Alumina, Hafnium oxide, and a Hi-K material layer.

28. The method of claim 15, wherein the implanting the ion species in an array source line region, and the removing the multi-layer dielectric-charge trapping-dielectric stack, the high-dielectric material layer, and the first polysilicon layer are both accomplished using the same local interconnect mask.

* * * * *